United States Patent
Kim et al.

(10) Patent No.: US 10,256,218 B2
(45) Date of Patent: Apr. 9, 2019

(54) LIGHT EMITTING DEVICE PACKAGE

(71) Applicant: SAMSUNG ELECTRONICS CO., LTD., Suwon-si (KR)

(72) Inventors: Kyoung Jun Kim, Yongin-si (KR); Yong Min Kwon, Seoul (KR); Geun Woo Ko, Yongin-si (KR); Pun Jae Choi, Yongin-si (KR); Dong Ho Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/941,299

(22) Filed: Mar. 30, 2018

(65) Prior Publication Data

US 2019/0019780 A1    Jan. 17, 2019

(30) Foreign Application Priority Data

Jul. 11, 2017  (KR) .................. 10-2017-0087557
Feb. 9, 2018  (KR) .................. 10-2018-0016246

(51) Int. Cl.
| | |
|---|---|
| *H01L 25/075* | (2006.01) |
| *H01L 33/62* | (2010.01) |
| *H01L 33/56* | (2010.01) |
| *H01L 33/54* | (2010.01) |

(52) U.S. Cl.
CPC .......... *H01L 25/0753* (2013.01); *H01L 33/54* (2013.01); *H01L 33/56* (2013.01); *H01L 33/62* (2013.01); *H01L 2933/005* (2013.01); *H01L 2933/0066* (2013.01)

(58) Field of Classification Search
CPC ..... H01L 25/0753; H01L 33/54; H01L 33/56; H01L 33/62
See application file for complete search history.

(56) References Cited

U.S. PATENT DOCUMENTS

| | | | |
|---|---|---|---|
| 6,297,598 B1 * | 10/2001 | Wang ................ | G02B 6/0068 257/E25.02 |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,812,498 B1 * | 11/2004 | Moon ................ | H01L 25/167 257/678 |
| 6,818,465 B2 | 11/2004 | Biwa et al. | |

(Continued)

FOREIGN PATENT DOCUMENTS

| | | |
|---|---|---|
| KR | 1020050001606 A | 1/2005 |
| KR | 100755615 B1 | 9/2007 |

(Continued)

*Primary Examiner* — Earl N Taylor
(74) *Attorney, Agent, or Firm* — Sughrue Mion, PLLC

(57) ABSTRACT

A light emitting device package includes: a plurality of light emitting chips configured to emit respective wavelength lights, each chip comprising electrodes at a bottom of the chip to form a flip-chip structure; a plurality of wirings directly connected to the electrodes of the chips, respectively; a plurality of electrode pads disposed below the chips and directly connected to the wirings, respectively; and a molding member integrally formed in a single layer structure to cover upper surfaces and side surfaces of the chips, and including a translucent material having a predetermined transmittance, wherein the wirings are disposed below a lower surface of the molding member.

20 Claims, 32 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,344,292 B2 | 3/2008 | Kim |
| 7,501,656 B2 | 3/2009 | Han et al. |
| 7,648,254 B2 * | 1/2010 | Yoo .................. H05K 1/0206 362/249.01 |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim et al. |
| 8,263,987 B2 | 9/2012 | Choi et al. |
| 8,304,789 B2 * | 11/2012 | Chen .................. H01L 25/0753 257/89 |
| 8,324,646 B2 | 12/2012 | Lee et al. |
| 8,362,499 B2 * | 1/2013 | van de ven ......... H01L 25/0753 257/89 |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,716,742 B2 * | 5/2014 | Chou .................. H05B 33/0806 257/99 |
| 8,735,931 B2 | 5/2014 | Han et al. |
| 8,766,295 B2 | 7/2014 | Kim |
| 8,835,946 B2 * | 9/2014 | Okada ................. H01L 25/0753 257/81 |
| 2004/0222433 A1 * | 11/2004 | Mazzochette ....... H01L 25/0753 257/99 |
| 2006/0291203 A1 * | 12/2006 | Anandan .............. G02B 6/0043 362/231 |
| 2007/0057364 A1 * | 3/2007 | Wang ........................ C03C 8/02 257/701 |
| 2008/0258695 A1 * | 10/2008 | Kumar ................. H05B 33/0818 323/223 |
| 2010/0103678 A1 * | 4/2010 | Van De Ven ............. F21K 9/00 362/294 |
| 2012/0112227 A1 * | 5/2012 | Toyama .............. H01L 25/0753 257/98 |
| 2012/0235581 A1 * | 9/2012 | Chou .................. H05B 33/0806 315/185 R |
| 2013/0234175 A1 * | 9/2013 | Okada ................. H01L 25/0753 257/89 |
| 2014/0175466 A1 * | 6/2014 | de Samber .......... H01L 25/0753 257/88 |
| 2015/0028373 A1 * | 1/2015 | Abe ........................ H01L 33/56 257/98 |
| 2015/0091787 A1 * | 4/2015 | Ohmae ...................... F21K 9/00 345/83 |
| 2015/0295140 A1 * | 10/2015 | Aoyagi ............... H01L 25/0753 257/99 |
| 2016/0149104 A1 * | 5/2016 | Bergmann ............... B23K 1/00 257/88 |
| 2016/0358896 A1 * | 12/2016 | Jeon .................... H01L 25/0753 |
| 2016/0380162 A1 * | 12/2016 | Lin ....................... H01L 33/505 257/98 |
| 2018/0040665 A1 * | 2/2018 | Ohmae ................... H01L 29/41 |

FOREIGN PATENT DOCUMENTS

| | | | |
|---|---|---|---|
| KR | 100764377 B1 | 10/2007 | |
| WO | WO-2010151600 A1 * | 12/2010 | ........... H01L 27/156 |

* cited by examiner

LIGHT EMITTING DEVICE PACKAGE

CROSS-REFERENCE TO THE RELATED APPLICATION

This application claims priority from Korean Patent Application No. 10-2017-0087557, filed on Jul. 11, 2017 and Korean Patent Application No. 10-2018-0016246, filed on Feb. 9, 2018 in the Korean Intellectual Property Office, the disclosure of which is incorporated herein by reference in its entirety.

BACKGROUND

1. Field

Apparatuses and methods consistent with the example embodiments of the inventive concept relate to a light emitting device package.

2. Description of Related Art

Semiconductor light emitting diode (LED) devices have been used as light sources for various electronic products, as well as light sources for lighting devices. In particular, semiconductor LEDs are widely used as the light sources of various types of display devices, such as televisions, mobile phones, personal computers (PCs), laptop PCs, and personal digital assistants (PDAs).

Conventional display devices were comprised of display panels, commonly liquid crystal display (LCD) panels, as well as backlight units. However, recently, display devices which do not require additional backlights, by using LEDs as a single pixel, have been under development. Such display devices may be made to be compact, and may be implemented as high lightness displays having improved optical efficiency as compared to LCDs of the related art. Such display devices may also allow an aspect ratio of a display image to be freely altered, and may be implemented as large display devices, thereby providing various forms of large displays.

SUMMARY

Example embodiments of the inventive concept may provide a compact easy-to-mount light emitting device package.

According to an aspect of an example embodiment, there is provided a light emitting device package which may include: a plurality of light emitting chips configured to emit respective wavelength lights, each chip including electrodes at a bottom of the chip to form a flip-chip structure; a plurality of wirings directly connected to the electrodes of the chips, respectively; a plurality of electrode pads disposed below the chips and directly connected to the wirings, respectively; and a molding member integrally formed in a single layer structure to cover upper surfaces and side surfaces of the chips, and including a translucent material having a predetermined transmittance, wherein the wirings are disposed below a lower surface of the molding member.

According to an aspect of the present inventive concept, there is provided a light emitting device package which may include: a plurality of light emitting chips configured to emit respective wavelength lights, each chip comprising electrodes at a bottom of the chip; a plurality of wirings connected to the electrodes of the chips, respectively; a plurality of electrode pads disposed below the chips and connected to the wirings, respectively; a molding member integrally formed in a single layer structure to cover upper surfaces and side surfaces of the chips, and including a material having a predetermined transmittance; and at least one of a metal layer disposed above the molding member, a colored lower layer disposed below the molding member, and a partition structure surrounding the chips.

According to an aspect of an example embodiment, there is provided comprising a plurality of pixel sets at least one of which may include a first pixel region, a second pixel region, and a molding member. The first pixel region may include: a plurality of first light emitting chips configured to emit respective wavelength lights; a plurality of first wirings connected to the first chips, respectively, and including a first common wiring commonly connected to the first chips; and a plurality of first electrode pads disposed below the first chips, and connected to the first wirings, respectively. The second pixel region adjacent to the first pixel region may include: a plurality of second light emitting chips configured to emit the respective wavelength lights; a plurality of second wirings connected to the second chips, respectively, and including a second common wiring commonly connected to the second chips; and a plurality of second electrode pads disposed below the second chips, and connected to the second wirings. The molding member may be disposed above the first pixel region and the second pixel region, and include a translucent material. Here, the first pixel region may share at least one of the first electrode pads included therein with the second pixel region such that at least one of the second wirings included in the second pixel region is connected to the shared electrode pad in the first pixel region.

According to an aspect of an example embodiment, there is provided a method of manufacturing a light emitting device package. The method may include: arranging a plurality of light emitting chips on a first adhesive tape; forming a molding member, including a translucent material, on the chips to entirely cover the chips; arranging the chips covered by the molding member on a second adhesive tape, such that an upper surface of the molding member is attached to the second adhesive tape; removing the first adhesive tape; forming a plurality of wirings and a plurality of electrode pads at a bottom of the chips where the first adhesive tape is removed; and cutting the molding member to obtain the light emitting device package comprising a plurality of pixels each of which comprises at least three of the light emitting chips.

BRIEF DESCRIPTION OF DRAWINGS

The above, and other aspects, features, and advantages of the inventive concept will be more clearly understood from the following detailed description when taken in conjunction with the accompanying drawings, in which.

DETAILED DESCRIPTION

Figure 1:
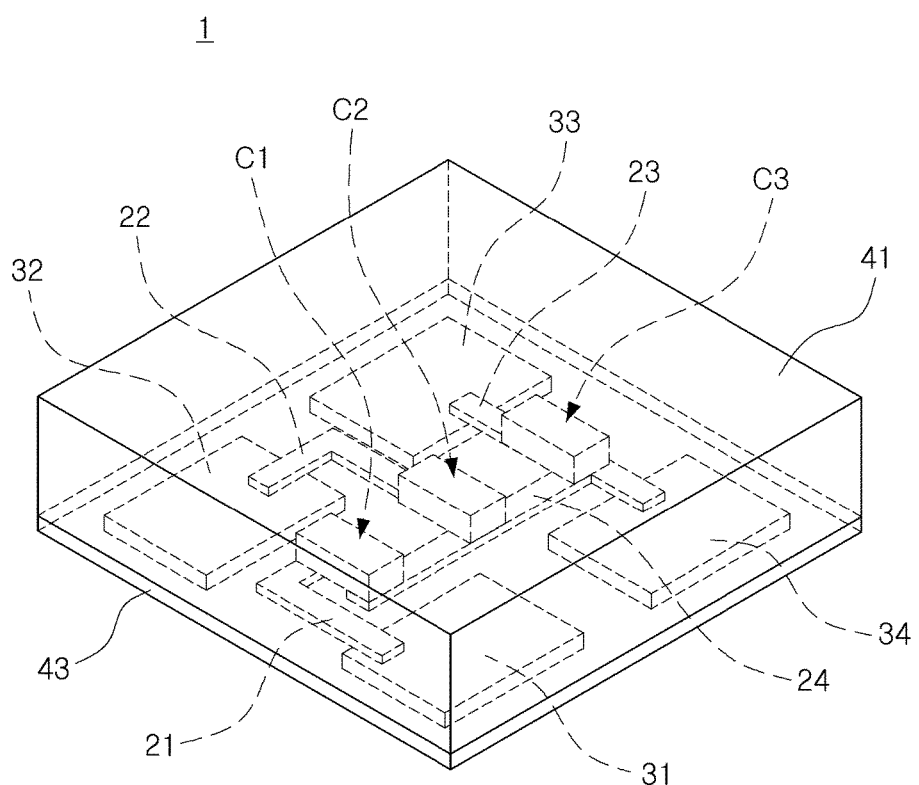
FIG. 1 is a perspective view illustrating a light emitting device package, according to an example embodiment.

Various example embodiments of the inventive concept will be described more fully hereinafter with reference to the accompanying drawings. The inventive concept may, however, be embodied in many different forms and should not be construed as limited to the example embodiments set forth herein. Rather, these example embodiments are provided so that this description will be thorough and complete, and will fully convey the scope of the inventive concept to those skilled in the art. In the drawings, the sizes and relative sizes of layers and regions may be exaggerated for clarity.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the inventive concept will be described in detail with reference to the attached drawings.

Figure 2A:
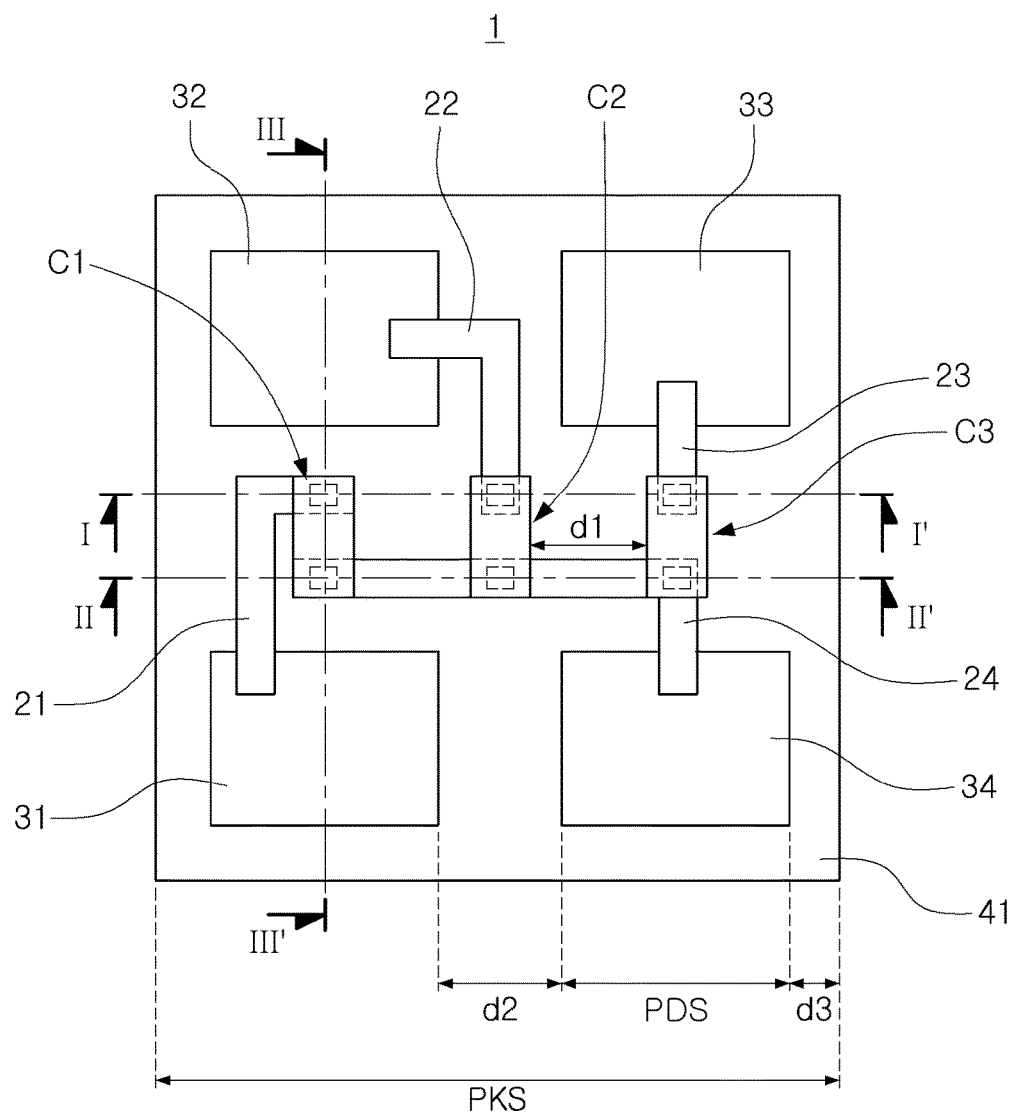
FIGS. 2A and 2B are plan and bottom views respectively illustrating a light emitting device package, according to example embodiments.
Figure 2B:
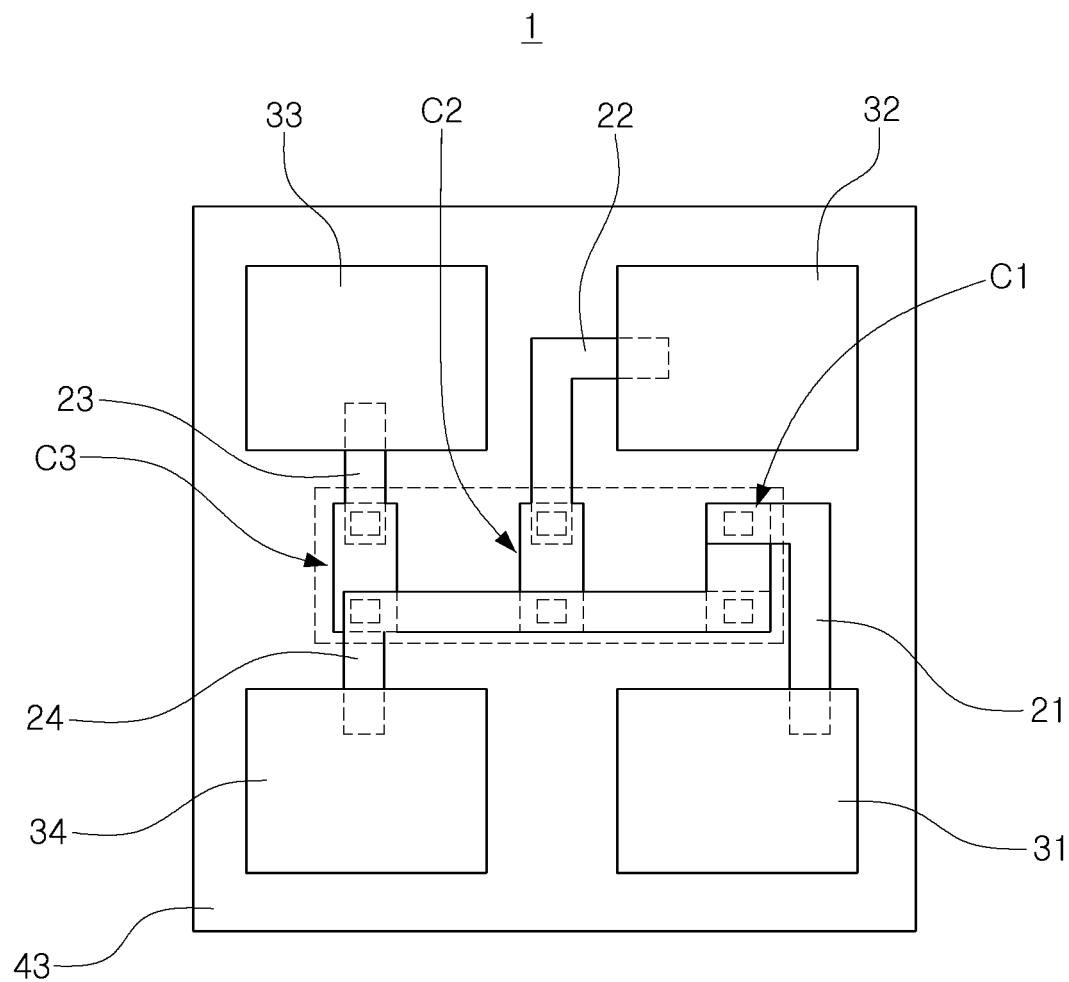
Figure 3A:
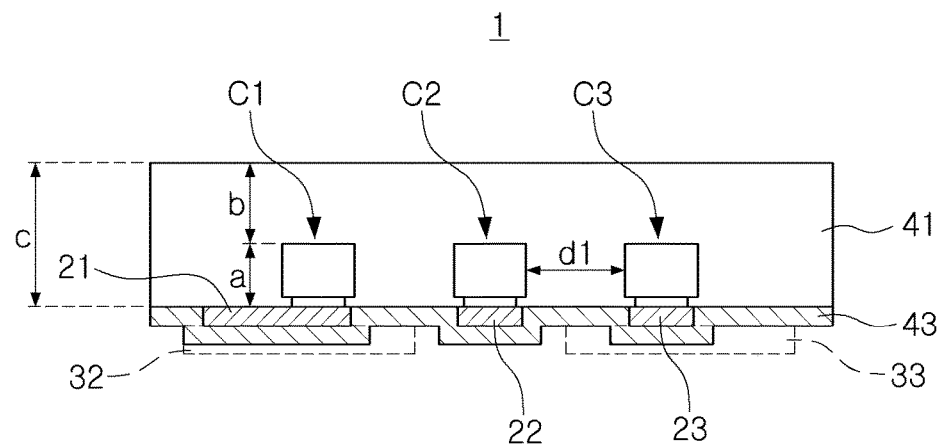
FIGS. 3A through 3C are cross-sectional views taken along lines I-I', II-II', and III-III' of FIG. 2A, respectively, according to example embodiments.
Figure 3B:
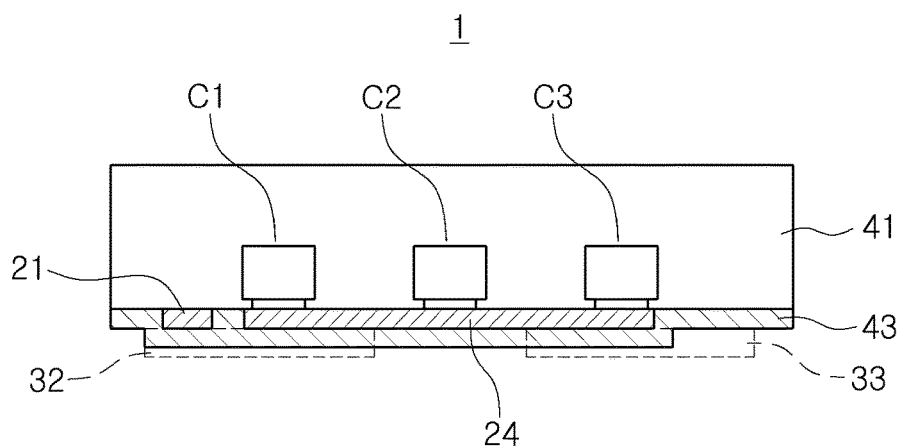
Figure 3C:
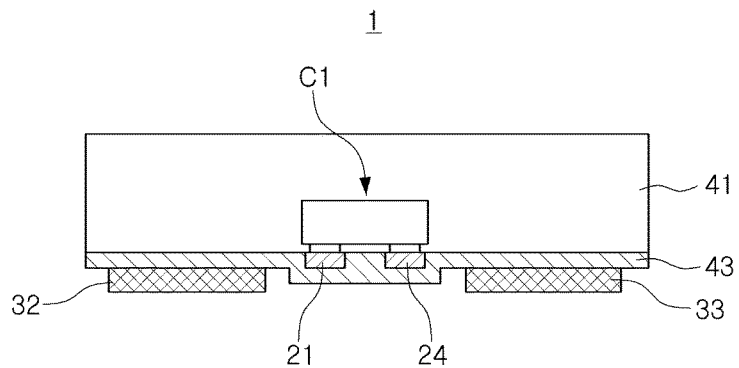

FIG. 1 is a perspective view illustrating a light emitting device package 1, according to an example embodiment. FIGS. 2A and 2B are plan and bottom views respectively illustrating a light emitting device package 1, according to example embodiments. FIGS. 3A through 3C are cross-sectional views taken along lines I-I', II-II', and III-III' of FIG. 2A, respectively.

Referring to FIGS. 1 through 3C, the light emitting device package 1 may include first to third light emitting chips C1 to C3, a molding member 41, first to third individual wirings 21 to 23, a common wiring 24, first to fourth electrode pads 31 to 34, and an insulating layer 43.

The first to third light emitting chips C1 to C3 may emit light having different wavelengths, and may be spaced apart from one another.

The first to third light emitting chips C1 to C3 may emit red light, green light, and blue light, respectively. The first light emitting chip C1 may be a red light emitting chip, the second light emitting chip C2 may be a green light emitting chip, and the third light emitting chip C3 may be a blue light emitting chip. The first light emitting chip C1 may include a semiconductor stack emitting red light, the second light emitting chip C2 may include a semiconductor stack emitting green light, and the third light emitting chip C3 may include a semiconductor stack emitting blue light. In an example embodiment, each of the first to third light emitting chips C1 to C3 may include a semiconductor stack emitting blue light or ultraviolet (UV) light, the first light emitting chip C1 may include a wavelength conversion layer emitting red light, the second light emitting chip C2 may include a wavelength conversion layer emitting green light, and the third light emitting chip C3 may include a wavelength conversion layer emitting blue light.

The first to third light emitting chips C1 to C3 may be arranged in a row in one direction. Referring to FIG. 3A, each of chip spacing d1 between the first light emitting chip C1 and the second light emitting chip C2 and spacing between the second light emitting chip C2 and the third light emitting chip C3 may be 10 μm or greater or 50 μm or greater. According to an example embodiment, the spacing may be 50 μm or greater. The first to third light emitting chips C1 to C3 may be disposed in the form of a flip chip. The first to third light emitting chips C1 to C3 may be disposed, such that upper surfaces, i.e., main light emitting surfaces of the first to third light emitting chips C1 to C3 may face upwardly and that first and second electrodes of each of the first to third light emitting chips C1 to C3 may face downwardly. The first electrodes of the first to third light emitting chips C1 to C3 may be connected to the first to third individual wirings 21 to 23, respectively, and the second electrodes of the first to third light emitting chips C1 to C3 may be commonly connected to the common wiring 24. When the first to third light emitting chips C1 to C3 are disposed in the form of a flip chip, each of the first to third light emitting chips C1 to C3 may have a beam angle of 160° or greater.

The molding member 41 may cover upper surfaces and side surfaces of the first to third light emitting chips C1 to C3. The molding member 41 may protect and support the first to third light emitting chips C1 to C3. The molding member 41 may have an elastic modulus of, for example, 2.0 GPa or greater. The molding member 41 may have a coefficient of thermal expansion of, for example, 40 ppm/°C. or less, lower than or equal to a glass transition temperature Tg.

When the light emitting device package 1 is used as a pixel of a display panel, the molding member 41 may be formed of a translucent resin to obtain a high contrast ratio. In the case that the molding member 41 has a thickness of about 50 μm, the molding member 41 may have a transmittance of 30% or greater and 89% or less with respect to light having a wavelength of 460 nm to 480 nm. Alternatively, with the same thickness, the molding member 41 may have a transmittance of 30% or greater and 89% or less with respect to light having a wavelength of 530 nm. The molding member 41 may have a lightness less than 100, and preferably but not necessary, less than 40. Accordingly, when the light emitting device package 1 mounted on a black printed circuit board (PCB) having a lightness of 20 is turned off, a difference between a lightness of the light emitting device package 1 having the molding member 41 and the lightness of the black PCB may be invisible.

The molding member 41 may include a transparent material, such as an epoxy resin, a silicone resin, a polyimide resin, polyester, or a combination thereof, not being limited thereto. Further, the molding member 41 may include carbon black of 0.005 wt % or greater and 1 wt % or less to obtain a desired transmittance and lightness as described above. The carbon black has a characteristic of absorbing light. The shorter a wavelength of light, the greater absorbance by the carbon black. Preferably, but not necessarily, the molding member 41 may include carbon black of, for example, 0.005 wt % or greater and 0.3 wt % or less. The molding member 41 may further include an inorganic filler to obtain a desired thermal expansion coefficient or elastic modulus. The inorganic filler may include fused silica particles or silicon dioxide ($SiO_2$) particles. The inorganic filler may have a cut size (a maximum particle size) of, for example, 100 μm or less. When the molding member 41 includes an inorganic filler of 50 wt % or greater, a transmittance of the molding member 41 is degraded due to light scattering.

The content of the molding member 41 may differ by a type of resin and an amount of inorganic filler included therein. In the case where a silicon resin and an inorganic filler of 50 wt % are used to form the molding member 41, the molding member 41 may include carbon black of 0.04 wt % or greater and 0.3 wt % or less, preferably but not necessary, 0.06 wt % or greater and 0.2 wt % or less. In the case where an epoxy resin and an inorganic filler of 50 wt % are used to form the molding member 41, the molding member 41 may include carbon black of 0.04 wt % or greater and 0.2 wt % or less, preferably but not necessary, 0.06 wt % or greater and 0.12 wt % or less.

Figure 4:
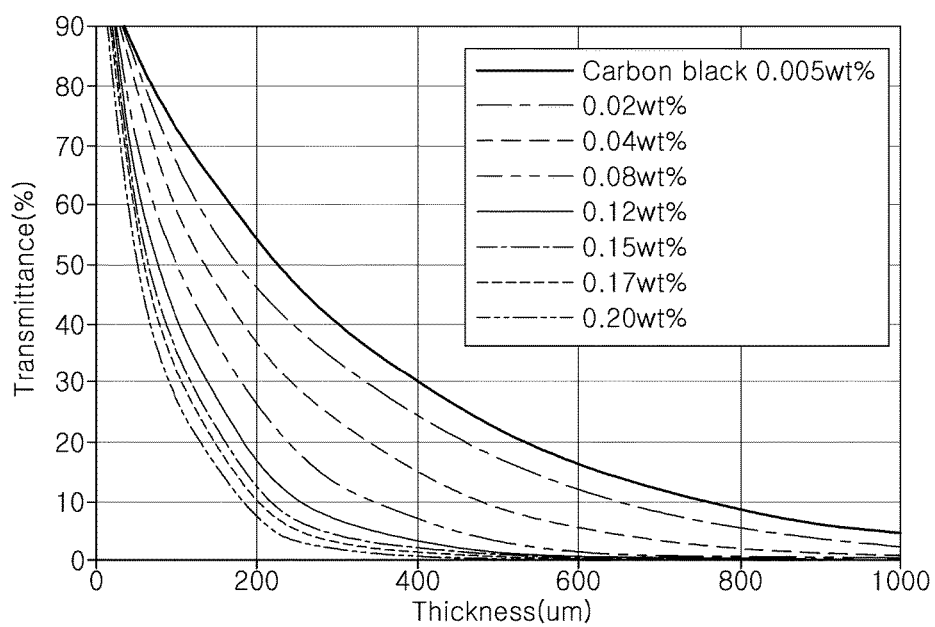
FIG. 4 is a graph illustrating a relationship between a transmittance and a thickness of a molding member, according to an example embodiment

FIG. 4 is a graph illustrating a relationship between a transmittance and a thickness of a molding member such as the molding member 41. Specifically, FIG. 4 illustrates changes in the transmittance of the molding member according to an amount of carbon black included therein. Further, the molding member used to measure the transmittance in FIG. 4 includes a silicon resin having fused silica of 50 wt %. Here, the transmittance is measured with respect to a wavelength of 520 nm. As shown in FIG. 4, the transmittance decreases as an amount of carbon black included in the molding member increases. It is also shown that the transmittance sharply decreases as the thickness of the molding member increases. For example, a molding member having 0.15 wt % of carbon black has a 59.1% transmittance when the thickness is 50 μm, and a 12.6% transmittance when the thickness is 200 μm.

Table 1 below shows various characteristics of different types of molding member that can be used in the light emitting device package 1 when the light emitting device package 1 is mounted on a black PCB having a lightness of 20. In Table 1, a type of molding member is defined by a resin type, an amount of inorganic filler, an amount of carbon black, and a thickness of molding member.

TABLE 1

| Type of Molding Member | Hue | Saturation | Lightness | R | G | B | Transmittance by Wavelength | | |
|---|---|---|---|---|---|---|---|---|---|
| | | | | | | | 470 nm | 530 nm | 620 nm |
| 1 | 123 | 189 | 18 | 4 | 32 | 34 | 15.8 | 17.4 | 19.8 |
| 2 | 40 | 8 | 75 | 82 | 82 | 77 | 29.2 | 33.3 | 38.7 |
| 3 | 160 | 0 | 0 | 0 | 0 | 0 | 4.0 | 4.6 | 5.3 |
| 4 | 110 | 10 | 87 | 88 | 96 | 94 | 24.8 | 26.4 | 28.0 |
| 5 | 138 | 31 | 104 | 96 | 112 | 125 | 22.9 | 24.3 | 25.9 |
| 6 | 139 | 19 | 126 | 124 | 134 | 143 | 35.2 | 37.2 | 39.4 |
| 7 | 138 | 27 | 135 | 131 | 145 | 156 | 32.8 | 34.5 | 36.3 |
| 8 | 138 | 21 | 154 | 156 | 165 | 172 | 43.4 | 45.4 | 47.8 |
| 9 | 128 | 26 | 44 | 42 | 50 | 52 | — | — | — |

In above Table 1, data such as hue, saturation, lightness, and RGB coordinates in an image were obtained by illuminating a white light on different types of molding member to obtain the image, and a transmittance was measured by transmitting a 470 nm light, a 530 nm light and a 620 nm light on the different types of molding member. The types of molding member in above Table 1 are as following:

Type 1: epoxy resin, silica 50 wt %, carbon 0.08 wt %, and thickness 200 μm
Type 2: epoxy resin, silica 50 wt %, carbon 0.04 wt %, and thickness 200 μm
Type 3: epoxy resin or silicon resin, silica 50 wt %, carbon 1 wt % or more, and thickness 200 μm
Type 4: silicone resin, silica 50 wt %, carbon 0.08 wt %, and thickness 200 μm
Type 5: silicone resin, silica 50 wt %, carbon 0.04 wt %, and thickness 300 μm
Type 6: silicone resin, silica 50 wt %, carbon 0.04 wt %, and thickness 200 μm
Type 7: silicone resin, silica 50 wt %, carbon 0.02 wt %, and thickness 300 μm
Type 8: silicone resin, silica 50 wt %, carbon 0.02 wt %, and thickness 200 μm
Type 9: epoxy resin, silica 87 wt %, carbon 0.3 wt %, and thickness 200 μm In example embodiments, the molding member 41 may not include the carbon black, and may include the inorganic filler. In other words, the molding member 41 may include at least one of the carbon black and the inorganic filler.

The molding member 41 may be, for example, a hexahedral shape covering a plurality of chips, that is, the first to third light emitting chips C1 to C3. Referring to FIG. 3A, the molding member 41 may have a thickness c of 500 μm or less and entirely cover the first to third light emitting chips C1 to C3. According to an example embodiment, the molding member 41 is integrally formed as a single member or layer to cover the upper surfaces and side surfaces of the first to third light emitting chips C1 to C3. Preferably, but not necessarily, the thickness c of the molding member 41 may be 20 μm or greater and 300 μm or less, and an upper thickness b measured from an upper surface of each light emitting chip to an upper surface of the molding member 41 may be 10 μm or greater and 200 μm or less. When each light emitting chip has a thickness a of 10 μm, the thickness c of the molding member 41 may be 20 μm or greater and 130 μm or less, and in this case, the upper thickness b of the molding member 41 is 10 μm or greater and 120 μm or less. When each light emitting chip has a thickness a of 100 μm, the thickness c of the molding member 41 may be 110 μm or greater and 220 μm or less, and in this case, the upper thickness b of the molding member 41 is 10 μm or greater and 120 μm or less.

By reducing the upper thickness b of the molding member 41 to a range of 20 μm to 120 μm, loss of light emitting from the upper surfaces of the first to third light emitting chips C1 to C3 may also be reduced. In contrast, since the molding member 41 is thicker at sides than an upper portion of each light emitting chip, a transmittance of light emitting from the side surfaces of each light emitting chip is relatively smaller. Therefore, a side portion of the molding member 41 surrounding the side surfaces of each light emitting chip is darker than the upper portion of the molding member 41, and thus, contrast of the light emitting device 1 may increase. In addition, when the light emitting device 1 is used as a pixel of a display panel, crosstalk between a plurality of light emitting devices, that is, pixels, may also be prevented.

The upper surface of the molding member 41 may include an uneven structure having a maximum roughness (Rmax) of 2 μm or greater. A lower portion of the molding member 41 may include a first region on which the first to third light emitting chips C1 to C3 arranged, and a second region surrounding the first region. The first region may have a quadrangular shape. The second region may have a quadrangular ring shape.

The first to third individual wirings 21 to 23 may be disposed on the lower surface of the molding member 41, may be connected, preferably but not necessarily directly, to the first electrodes of the first to third light emitting chips C1 to C3, respectively, in the first region, and may extend from the first region to the second region. The common wiring 24 may be disposed on the lower surface of the molding member 41, may be commonly, and preferably but not necessarily directly, connected to the second electrodes of the first to third light emitting chips C1 to C3, and may extend from the first region to the second region. Each of the first to third individual wirings 21 to 23 and the common wiring 24 may be formed of a metallic material. The metallic material may include, for example, gold, silver, copper, or aluminum.

The first to fourth electrode pads 31 to 34 may be disposed in the second region included in the lower surface of the molding member 41. The first to fourth electrode pads 31 to 34 may be disposed adjacent to vertexes of the lower surface of the molding member 41. Referring to FIG. 2A, a package spacing d3 between an edge of at least one of the electrode pads 31 to 34 and a side surface of the molding member 41 is 500 μm or less, preferably but not necessarily, 220 μm or less, when viewed in a plan view (e.g., FIG. 2A) of the light emitting device package 1. The first to fourth electrode pads 31 to 34 may be connected to the first to third individual wirings 21 to 2'3 and the common wiring 24, respectively. In detail, the first electrode pad 31 may be in contact, preferably but not necessarily in direct contact, with the first individual wiring 21, the second electrode pad 32 may be in contact, preferably but not necessarily in direct contact, with the second individual wiring 22, and the third electrode pad 33 may be in contact, preferably but not necessarily in direct contact, with the third individual wiring 23. The fourth electrode pad 34 may be in contact, preferably but not necessarily in direct contact, with the common wiring 24. The fourth electrode pad 34 may be referred to as a common pad.

Referring to FIG. 2A again, the first to fourth electrode pads 31 to 34 may have a pad spacing d2 of 50 μm or greater thereamong in at least one direction. Each of the first to fourth electrode pads 31 to 34 may have a pad size PS of, for example, 50 μm×50 μm or more. Each of the first to fourth electrode pads 31 to 34 may be formed of a metallic material. The metallic material may include, for example, gold, silver, copper, or aluminum.

Each of the first to fourth electrode pads 31 to 34 may be formed of a magnetic metallic material. The magnetic metallic material may include at least one of iron, nickel, or cobalt. For example, the magnetic metallic material may be formed of at least one of Fe alloy, Ne—Fe—Mo, Fe—Si—Al, etc., not being limited thereto. Each of the first to fourth electrode pads 31 to 34 may have a stack structure coated with the metallic material having no magnetism, and with the magnetic metallic material on a surface of at least a portion of the metallic material. Since the first to fourth electrode pads 31 to 34 include the magnetic metallic material, the light emitting device package 1 can be easily attached to or detached from a PCB module. Thus, processes of mounting the light emitting device package 1 on the PCB module and removing the same therefrom can also be implemented with ease. Here, the PCB module may include a metallic pad having magnetism on which the electrode pads 31 to 34 are mounted.

The insulating layer 43 may be disposed on the lower surface of the molding member 41, may cover the first to third individual wirings 21 to 23 and the common wiring 24 and insulate these wirings from one another, and may have an open region through which the first to fourth electrode pads 31 to 34 may be in contact with the first to third individual wirings 21 to 23 and the common wiring 24, respectively. Each of the first to third individual wirings 21 to 23 and the common wiring 24 may have a contact region, and the insulating layer 43 may be disposed on the lower surface of the molding member 41, such that the contact regions of the first to third individual wirings 21 to 23 and the common wiring 24 may be open.

The light emitting device package 1 according the above example embodiments is configured not to use a PCB and a lead-frame, and thus, a thickness of the light emitting device package 1 is much smaller than that of related art light emitting devices having light emitting chips mounted on the PCB and the lead-frame. According to an example embodiment, a thickness of the light emitting device package 1 may range 30 to 500 μm or 100 to 300 μm. According to an example embodiment, a package length PKS of the light emitting device package 1 may be about 700 μm.

Figure 5:
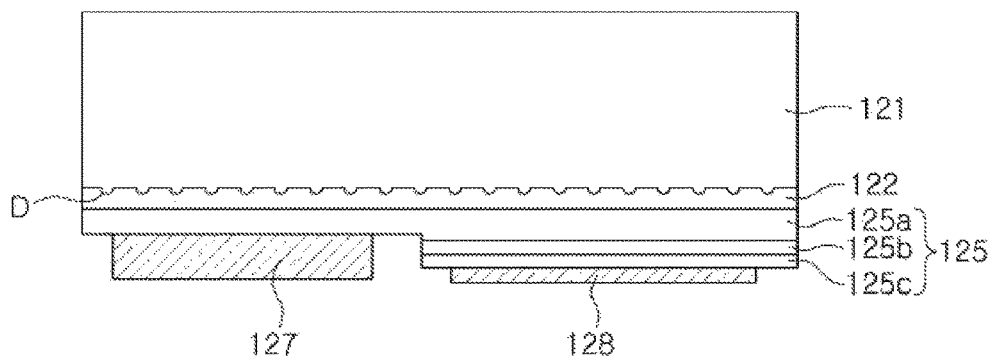
FIGS. 5 and 6 are cross-sectional views illustrating light emitting devices employed in a light emitting device package, according to example embodiments.
Figure 6:
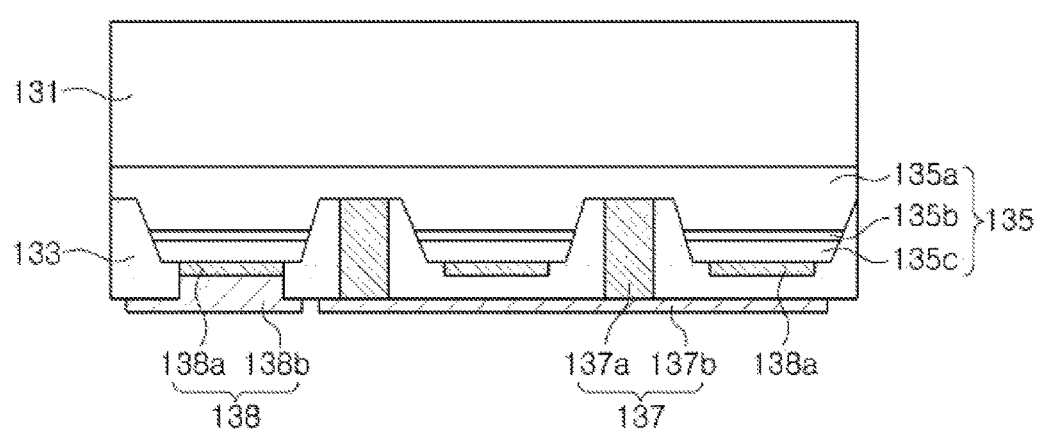

FIGS. 5 and 6 are cross-sectional views illustrating light emitting chips employable in a light emitting device package, according to an example embodiment.

A light emitting chip 120, illustrated in FIG. 5, may include a light transmitting substrate 121 and a semiconductor stack 125 disposed on the light transmitting substrate 121.

The light transmitting substrate 121 may be an insulating substrate, such as sapphire, but is limited thereto. The light transmitting substrate 121 may be a conductive substrate or a semiconductor substrate which may ensure light transmittance properties, other than the insulating substrate. An upper surface of the light transmitting substrate 121 may be a main light emitting surface. An uneven pattern D may be formed on the upper surface of the light transmitting substrate 121. The unevenness pattern D may increase light extraction efficiency and improve the quality of a single crystal being grown on the light transmitting substrate 121.

The semiconductor stack 125 may include a first conductivity-type semiconductor layer 125a, an active layer 125b, and a second conductivity-type semiconductor layer 125c, sequentially stacked on the light transmitting substrate 121. A buffer layer 122 may be disposed between the light transmitting substrate 121 and the first conductivity-type semiconductor layer 125a.

The buffer layer 122 may be $In_xAl_yGa_{1-x-y}N$ ($0 \leq x \leq 1$, $0 \leq y \leq 1$). For example, the buffer layer 122 may include GaN, AlN, AlGaN, or InGaN. The buffer layer 122 may be further formed by combining a plurality of layers or gradually changing compositions thereof.

The first conductivity-type semiconductor layer 125a may be a nitride semiconductor layer satisfying n-type $In_xAl_yGa_{1-x-y}N$ ($0 \leq x < 1$, $0 \leq y < 1$, $0 \leq x+y < 1$), and an n-type impurity may be Si. For example, the first conductivity-type semiconductor layer 125a may include n-type GaN. The second conductivity-type semiconductor layer 125c may be a nitride semiconductor layer satisfying p-type $In_xAl_yGa_{1-x-y}N$ ($0 \leq x < 1$, $0 \leq y < 1$, $0 \leq x+y < 1$), and a p-type impurity may be Mg. For example, the second conductivity-type semiconductor layer 125c may have a single layer structure, and may further have a multilayer structure having different compositions. The active layer 125b may have a multiple quantum well (MQW) structure in which quantum well layers and quantum barrier layers are alternately stacked on each other. For example, the quantum well layers and the quantum barrier layers may include different compositions of $In_xAl_yGa_{1-x-y}N$ ($0 \leq x \leq 1$, $0 \leq y \leq 1$, $0 \leq x+y \leq 1$), respectively. In an example embodiment, the quantum well layers may include a composition of $In_xGa_{1-x}N$ ($0 < x \leq 1$), and the quantum barrier layers may include GaN or AlGaN. The active layer 125b may have a single quantum well (SQW) structure. However, the present inventive concept is not limited thereto.

While the semiconductor stack 125 is described as being formed of an InAlGaN-based nitride semiconductor material, the present inventive concept is not limited thereto.

A first electrode 127 and a second electrode 128 may be disposed in a mesa-etched region of the first conductivity-type semiconductor layer 125a and on the second conductivity-type semiconductor layer 125c, respectively, such that the first and second electrodes 127 and 128 may be disposed on the same side (a first surface). For example, the first electrode 127 may include at least one of Al, Au, Cr, Ni, Ti, and Sn. The second electrode 128 may be formed of a reflective metal. For example, the second electrode 128 may include a material, such as Au, Ni, Al, Cr, Rh, Pd, Ir, Ru, Mg, Zn, Pt, or Au, and may be employed as a structure having a single layer or two or more layers.

When the semiconductor stack 125 emits blue light or UV light, a wavelength conversion layer, including a phosphor or quantum dots, may be further provided on the light transmitting substrate 121.

A light emitting chip 130, illustrated in FIG. 6, may include a semiconductor stack 135 disposed on a light transmitting substrate 131. The semiconductor stack 135 may include a first conductivity-type semiconductor layer 135a, an active layer 135b, and a second conductivity-type semiconductor layer 135c. The light emitting chip 130 may include first and second electrodes 137 and 138 connected to the first and second conductivity-type semiconductor layers 135a and 135c, respectively. The first electrode 137 may include a connecting electrode 137a, such as conductive vias, passing through the second conductivity-type semiconductor layer 135c and the active layer 135b to be connected to the first conductivity-type semiconductor layer 135a, and a first electrode pad 137b connected to the connecting electrode 137a.

The connecting electrode 137a may be surrounded by an insulator 133 to be electrically separated from the active layer 135b and the second conductivity-type semiconductor layer 135c. The connecting electrode 137a may be disposed in a region in which the semiconductor stack 135 is etched. The connecting electrode 137a may be properly designed in terms of number, shape, pitch, or contact area with the first conductivity-type semiconductor layer 135a, such that contact resistance may be reduced. The connecting electrode 137a may be further arranged to form rows and columns on the semiconductor stack 135, thus improving a current flow. The second electrode 138 may include an ohmic contact layer 138a and a second electrode pad 138b disposed on the second conductivity-type semiconductor layer 135c.

The connecting electrode 137a and the ohmic contact layer 138a may include a single layer or a multilayer structure formed of a conductive material having ohmic characteristics with the first and second conductivity-type semiconductor layers 135a and 135c. For example, the connecting electrode 137a and the ohmic contact layer 138a may be formed using a process of depositing or sputtering one or more materials, such as Ag, Al, Ni, Cr, a transparent conductive oxide (TCO), and the like. The first and second electrode pads 137b and 138b may be connected to the connecting electrode 137a and the ohmic contact layer 138a, respectively, to function as an external terminal of the light emitting chip 130. For example, each of the first and second electrode pads 137b and 138b may include Au, Ag, Al, Ti, W, Cu, Sn, Ni, Pt, Cr, NiSn, TiW, AuSn, or eutectic metals thereof. The insulator 133 may include, for example, a silicon oxide or a silicon nitride such as $SiO_2$, $SiO_xN_y$, or $Si_xN_y$. The insulator 133 may be formed by dispersing a light-reflective filler in a light transmitting material, or introducing a distributed Bragg reflector (DBR) structure, in order to secure higher reflectivity.

When the semiconductor stack 135 emits blue light or UV light, a wavelength conversion layer, including a phosphor or quantum dots, may be further provided on the light transmitting substrate 131.

FIGS. 7A through 7H are cross-sectional views illustrating a method of manufacturing the light emitting device package 1, according to an example embodiment. The manufacturing method may be performed on a wafer level, and a single light emitting device package will mainly be described with reference to FIGS. 7A through 7H.

Figure 7A:
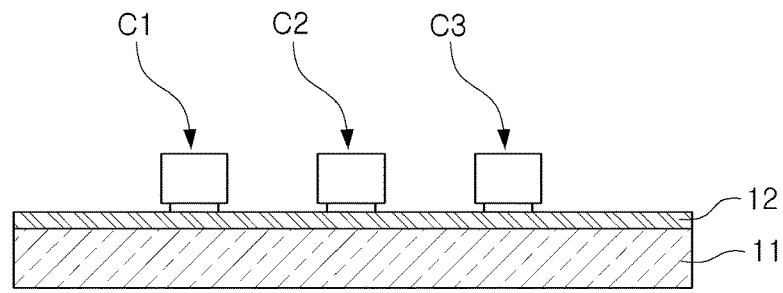
FIGS. 7A through 7H are cross-sectional views illustrating a method of manufacturing a light emitting device package, according to an example embodiment.

Referring to FIG. 7A, an adhesive tape 12 may be attached to a carrier wafer 11, and first to third light emitting chips C1 to C3 may be arranged at desired intervals. The first to third light emitting chips C1 to C3 may emit light having different wavelengths. The adhesive tape 12 may be, for example, a thermal release tape. When the carrier wafer 11 has UV light transmittance properties, the adhesive tape 12 may be a UV release tape. The type of the adhesive tape 12 is not limited thereto.

Figure 7B:
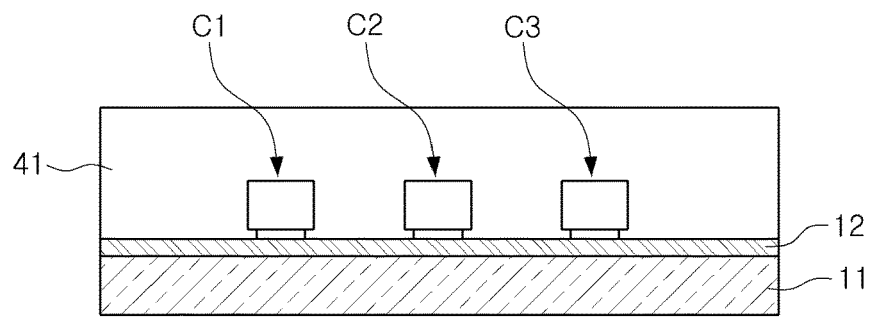

Referring to FIG. 7B, a molding member 41 may be integrally formed as a single member or layer to entirely cover the first to third light emitting chips C1 to C3. The molding member 41 may be formed using, for example, a coating process and a curing process.

Figure 7C:
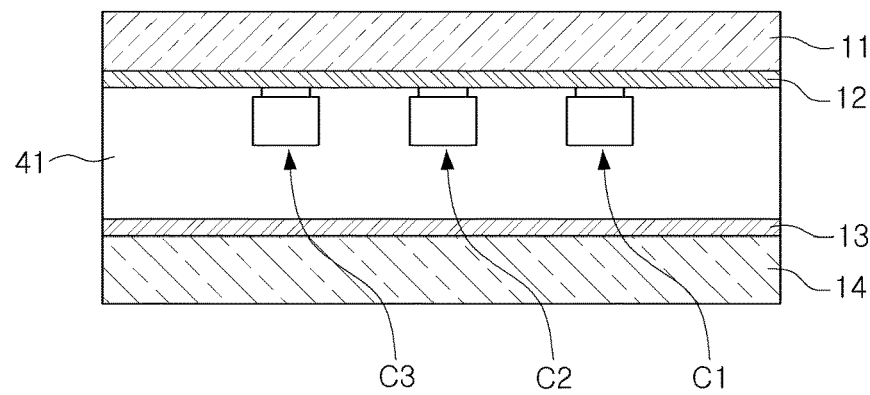

Referring to FIG. 7C, a carrier wafer 14 may be attached to an upper surface of the molding member 41, using adhesive tape 13. For example, the carrier wafer 14 may be a glass substrate transmitting UV light, and the adhesive tape 13 may be a UV release tape. Further, the adhesive tape 13 may be a thermal release tape.

Figure 7D:
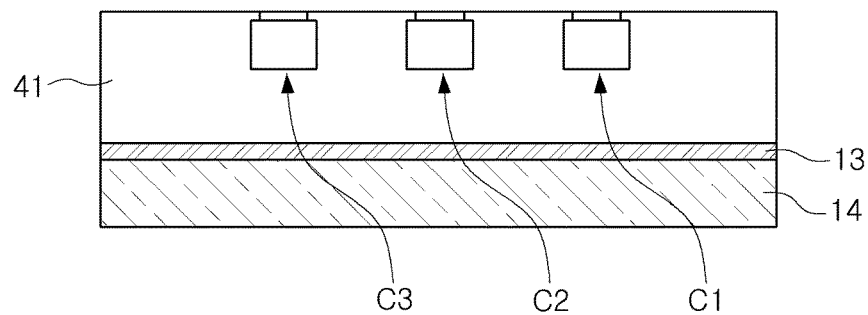

Referring to FIG. 7D, the carrier wafer 11 may be removed. For example, when the adhesive tape 12 is a thermal release tape, the carrier wafer 11 may be removed by heating the adhesive tape 12. Thus, first and second electrodes of the first to third light emitting chips C1 to C3 may be exposed to one surface of the molding member 41.

Figure 7E:
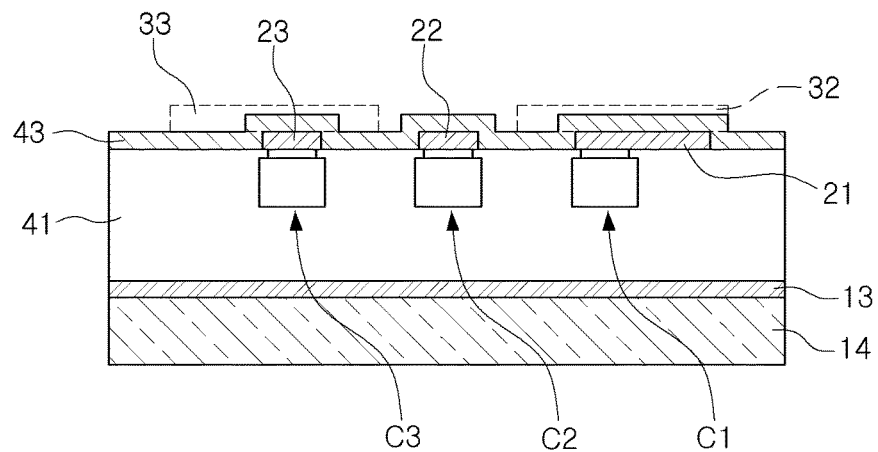

Referring to FIG. 7E, first to third individual wirings 21 to 23 respectively connected to the first electrodes of the first to third light emitting chips C1 to C3, and a common wiring 24 commonly connected to the second electrodes of the first to third light emitting chips C1 to C3 may be formed. An insulating layer 43 may be formed to cover the first to third individual wirings 21 to 23 and the common wiring 24. The insulating layer 43 may have open regions exposing contact regions of the first to third individual wirings 21 to 23 and the common wiring 24. First to fourth electrode pads 31 to 34 may be formed to be in contact with the contact regions. A plurality of light emitting device packages may be formed on the carrier wafer 14.

Figure 7F:
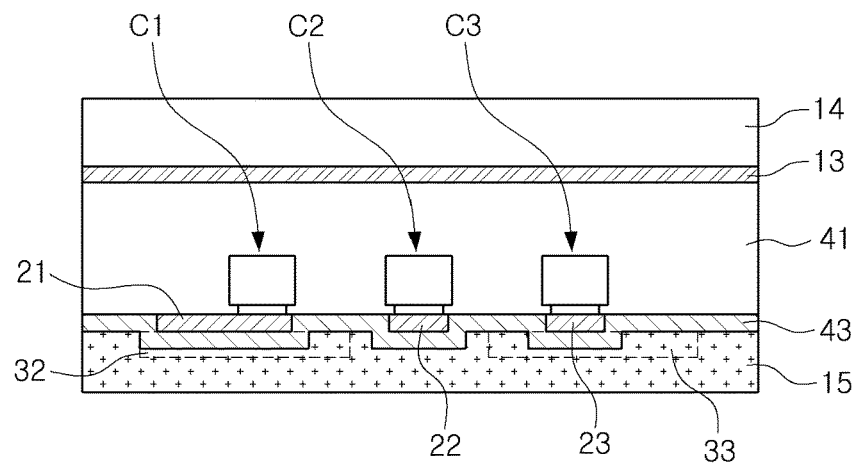

Referring to FIG. 7F, in order to remove the carrier wafer 14, a tape 15 may be attached to cover the first to fourth electrode pads 31 to 34 of the light emitting device packages.

Figure 7G:
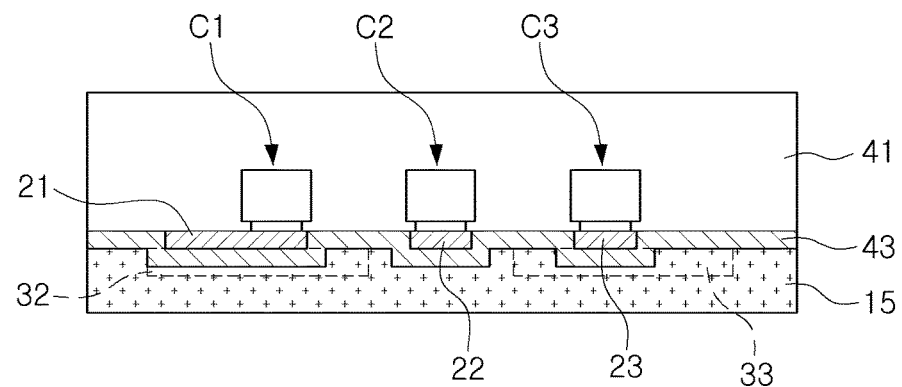

Referring to FIG. 7G, the carrier wafer 14 may be removed. For example, when the adhesive tape 13 is a UV release tape, the carrier wafer 14 may be removed by radiating UV light to the adhesive tape 13.

Figure 7H:
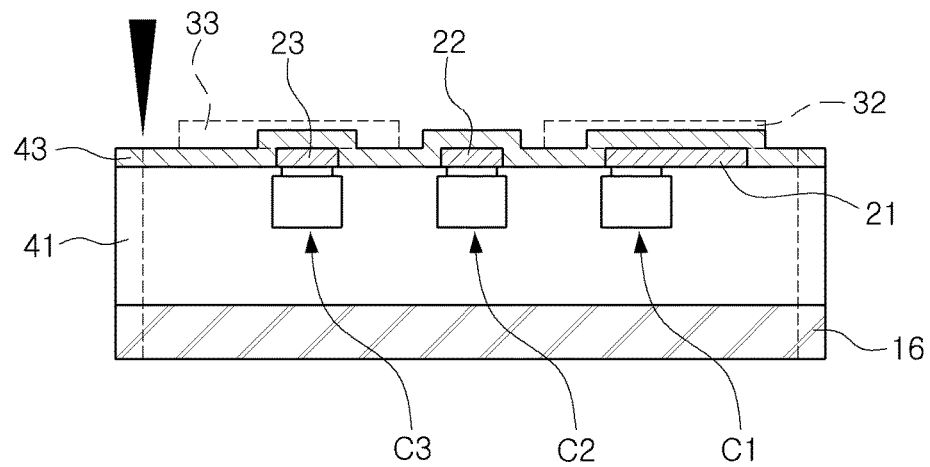

Referring to FIG. 7H, the light emitting device packages may be transferred to a dicing tape 16 and cut to desired dimensions, for example, dimensions including one or more sets of the three light emitting chips C1 to C3, to fabricate an individual light emitting device package having a desired number of sets of the three light emitting chips C1 to C3.

Figure 8:
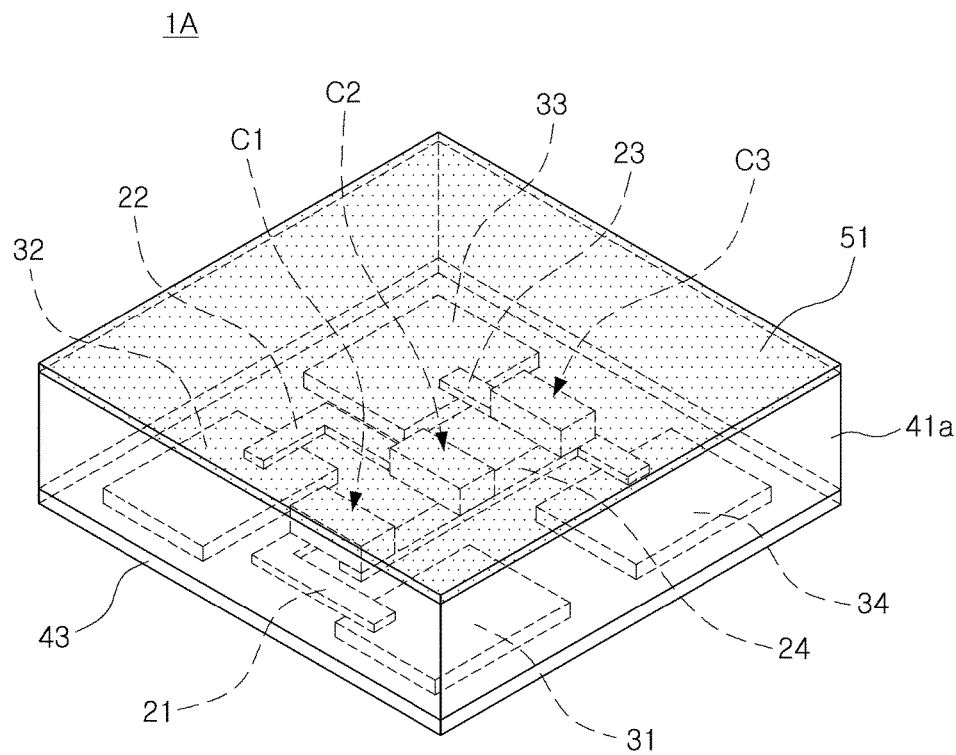
FIG. 8 is a projected perspective view illustrating a light emitting device package, according to an example embodiment.
Figure 9:
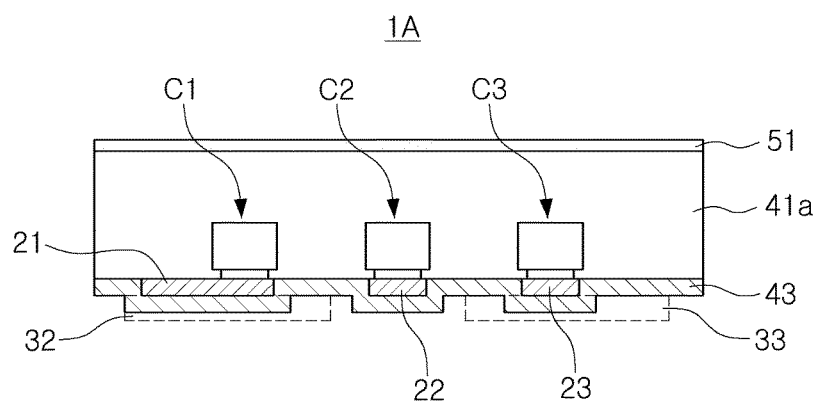
FIG. 9 is a cross-sectional view of FIG. 8, according to an example embodiment.

FIG. 8 is a projected perspective view illustrating a light emitting device package 1A, according to an example embodiment. FIG. 9 is a cross-sectional view of FIG. 8. FIG. 9 corresponds to a cross-sectional view taken along line I-I' of FIG. 3A.

Referring to FIGS. 8 and 9, the light emitting device package 1A may further include a metal layer 51 disposed above an upper surface of a molding member 41a, as compared to the light emitting device package 1.

The metal layer 51 may include one of titanium, chromium, or combinations thereof. The metal layer 51 may be a thin film formed to have a reduced thickness at which at least a portion of light emitted from the first to third light emitting chips C1 to C3 may penetrate through the thin film. The metal layer 51 may be formed using a physical vapor deposition (PVD) process or a chemical vapor deposition (CVD) process. In the present example embodiment, the molding member 41a may be formed of only a transparent material, such as at least one of an epoxy resin, a silicone resin, a polyimide resin, a polyester, etc. By forming the metal layer 51 on the upper surface of the molding member 41a, a high contrast ratio may be obtained when the light emitting device package 1A is used as a pixel of a display panel. According to an example embodiment, the molding member 41a may be formed of a translucent material even if the metal layer 51 is disposed thereon to obtain a high contrast ratio.

Figure 10:
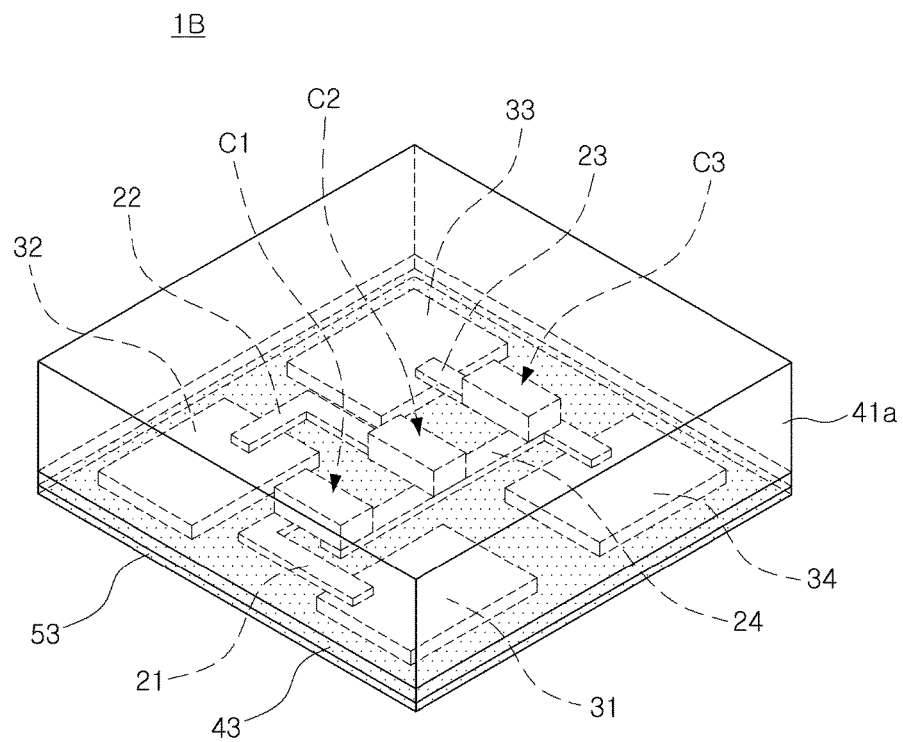
FIG. 10 is a projected perspective view illustrating a light emitting device package, according to an example embodiment.
Figure 11:
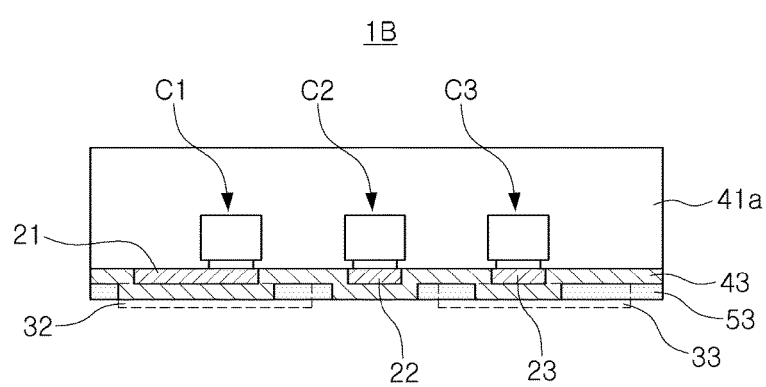
FIG. 11 is a cross-sectional view of FIG. 10, according to an example embodiment.

FIG. 10 is a projected perspective view illustrating a light emitting device package 1B, according to an example embodiment. FIG. 11 is a cross-sectional view of FIG. 10. FIG. 11 corresponds to a cross-sectional view taken along line I-I' of FIG. 3A.

Referring to FIGS. 10 and 11, a light emitting device package 1B may further include a lower layer 53 disposed below a lower surface of a molding member 41a, as compared to the light emitting device package 1.

The lower layer 53 may be formed of, for example, a black resin, such as a black matrix or the like including chromium or a black pigment. However, the present inventive concept is not limited thereto. The lower layer 53 may include a proper material that may absorb visible light. The lower layer 53 may expose first to fourth electrode pads 31 to 34, and may cover an insulating layer 43.

In the present example embodiment, the molding member 41a may be formed only of a transparent material, such as at least one of an epoxy resin, a silicone resin, a polyimide resin, a polyester, etc. By forming the lower layer 53 below a lower (or bottom) surface of the molding member 41a, a high contrast ratio may be obtained when the light emitting device package 1B is used as a pixel of a display panel. According to an example embodiment, the molding member 41a may be formed of a translucent material even if the lower layer 53 is disposed below the molding member 41a to obtain a high contrast ratio.

Figure 12:
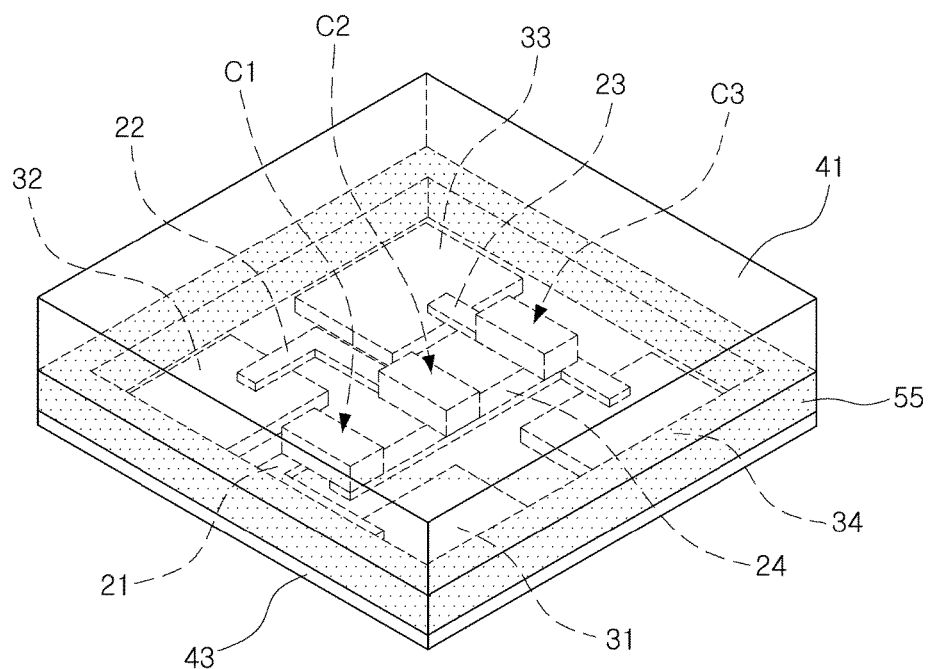
FIG. 12 is a projected perspective view illustrating a light emitting device package, according to an example embodiment.
Figure 13A:
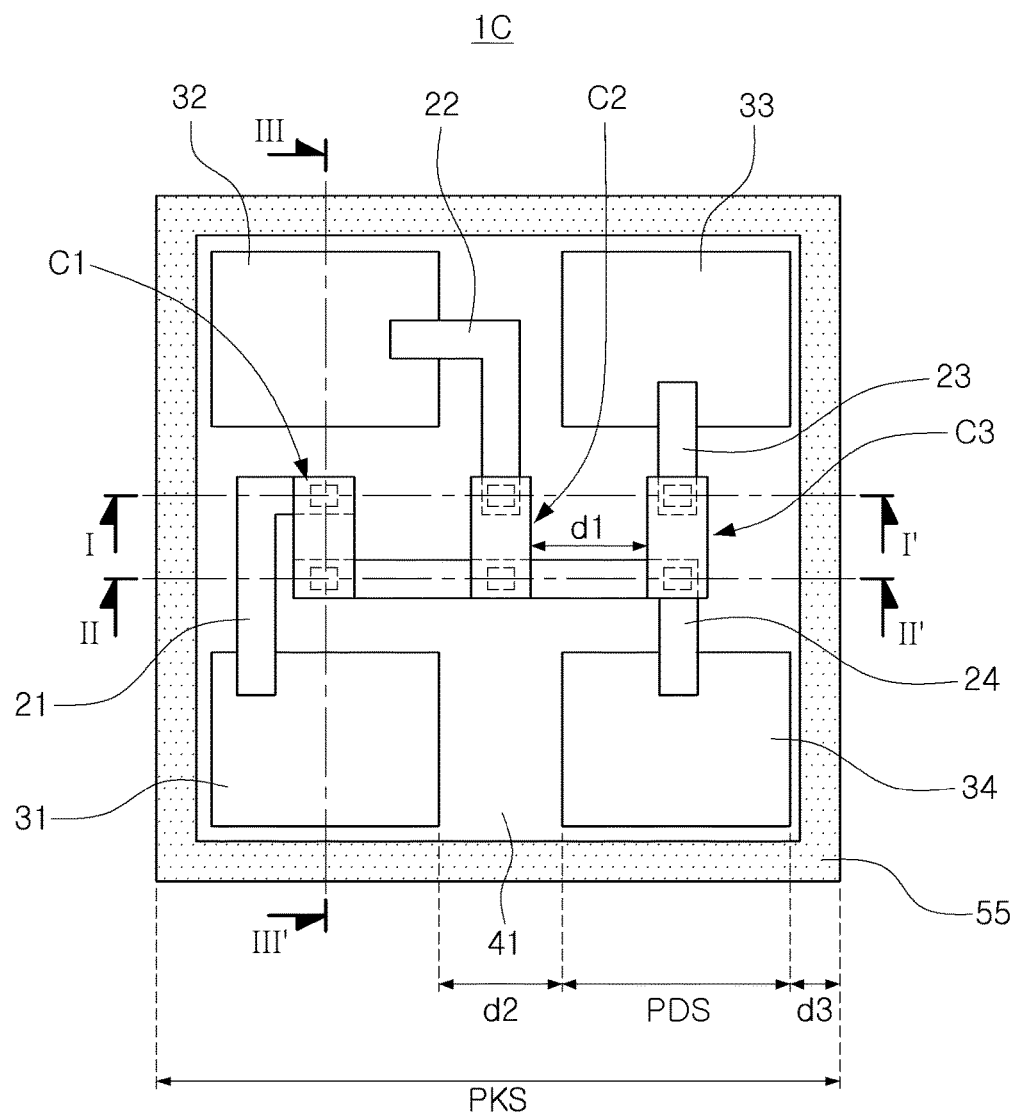
FIGS. 13A and 13B are plan and bottom views respectively illustrating a light emitting device package, according to an example embodiment.
Figure 13B:
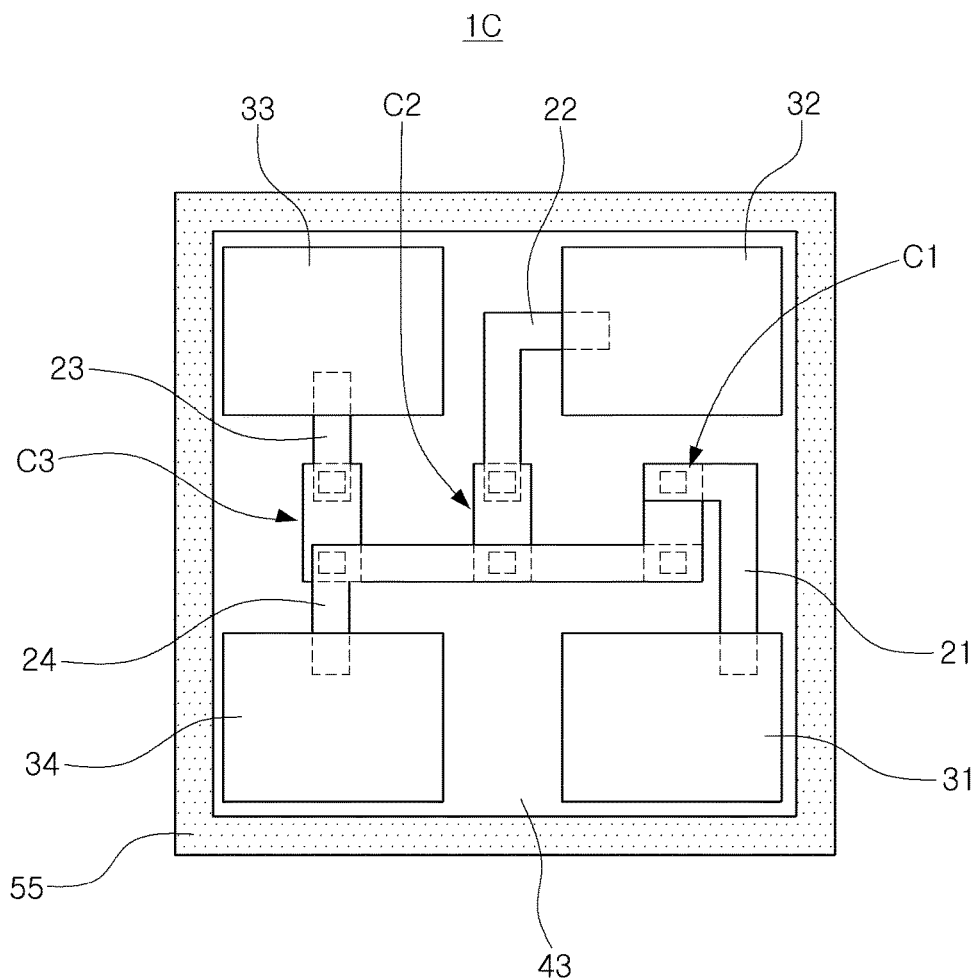
Figure 14A:
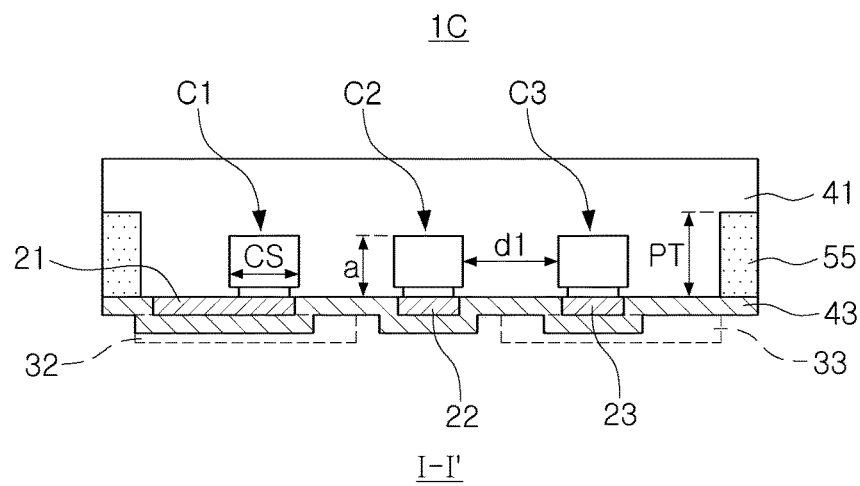
FIGS. 14A through 14C are cross-sectional views taken along lines I-I', II-II', and III-III' of FIG. 12A, respectively, according to an example embodiment.
Figure 14B:
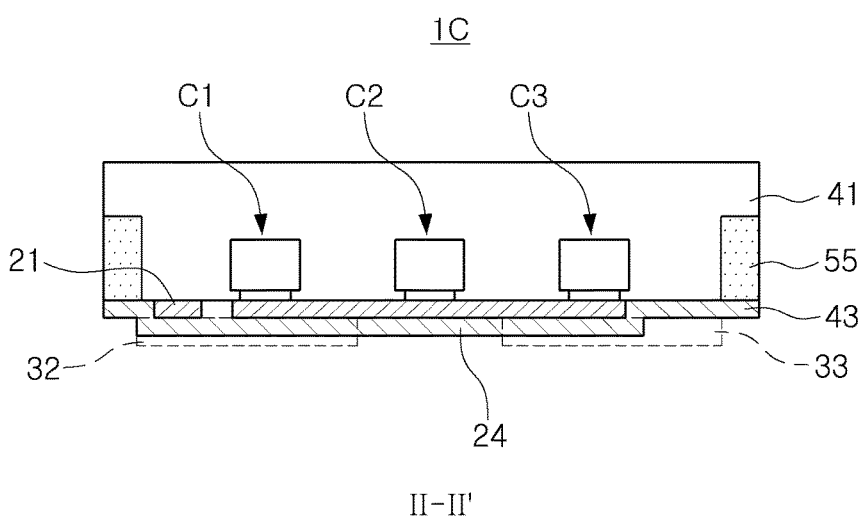
Figure 14C:
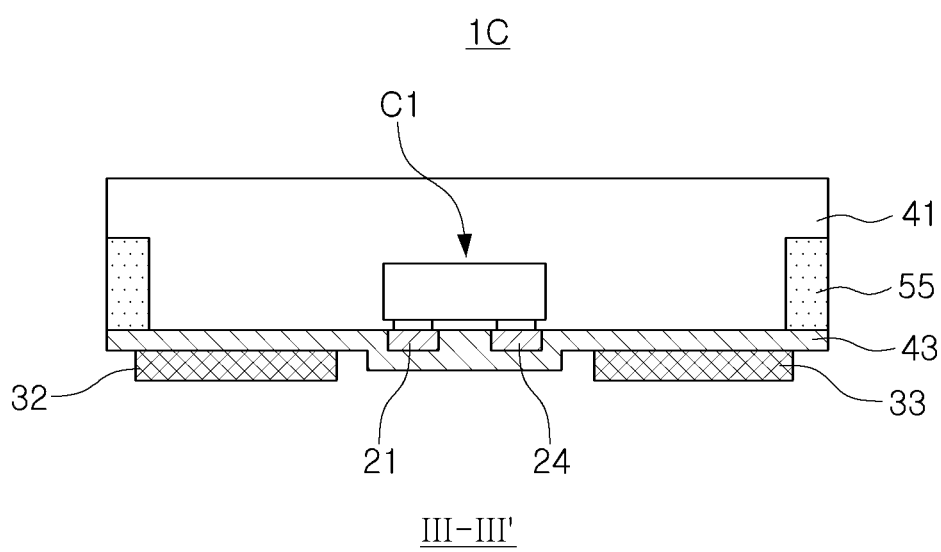

FIG. 12 is a projected perspective view illustrating a light emitting device package 1C, according to an example embodiment. FIGS. 13A and 13B are plan and bottom views respectively illustrating the light emitting device package 1C, according to an example embodiment. FIGS. 14A through 14C are cross-sectional views taken along lines I-I', II-II', and III-III' of FIG. 13A, respectively.

Referring to FIGS. 12 through 14C, the light emitting device package 1C may further include a partition structure 55 surrounding first to third light emitting chips C1 to C3, as compared to the light emitting device package 1. The partition structure 55 may be formed of a black resin, such as a black matrix or the like. Further, the partition structure 55 may be a metal structure whose surface is coated with titanium, chromium, or combinations thereof. The metal structure may be formed, for example, of copper, aluminum, a combination thereof, or the like. The partition structure 55 may be formed of a ceramic material such as glass frit. Due to the partition structure 55, the light emitting device package 1C may have a greater elastic modulus, for example, 2.0 GPa or greater, and a smaller thermal expansion coefficient, for example, 30 ppm/° C., than the light emitting device package 1. Thus, when the light emitting device package 1C is mounted on a PCB having a thermal expansion coefficient of 10 to 20 ppm/° C., a mismatch of thermal expansion coefficients may be prevented.

In addition, the light emitting device package 1C may have a greater rigidity than the light emitting device package 1. The resin forming the molding member 41 may have a thermal expansion coefficient of 30 to 100 ppm/° C. In the case that the partition structure 55 is a metallic structure, the partition structure 55 may have an elastic modulus of 2.0 GPa or greater and a thermal expansion coefficient of 10 to 30 ppm/° C. function to function as a heat sink. In the case that the partition structure 55 is formed of glass frit, the partition structure 55 may have an elastic modulus of 2.0 GPa or greater and a thermal expansion coefficient of 20 ppm/° C. or less.

The partition structure 55 may have inclined side walls, unlike illustrated in FIGS. 12 through 14C. A height PT of the partition structure 55 may be greater than those of the first to third light emitting chips C1 to C3. For example, the height PT of the partition structure 55 may be 80 μm or greater, and a top surface of the partition structure 55 may be lower than a top surface of the molding member 41. The smaller the height of the partition structure 55, the greater the angle of beam spread is achieved with respect to the upper surface of each of the light emitting chips C1 to C3. In addition, the greater the height of the partition structure 55, the smaller the angle of beam spread and a color of angle (COA) are. The molding member 41 may cover the partition structure 55.

Figure 15:
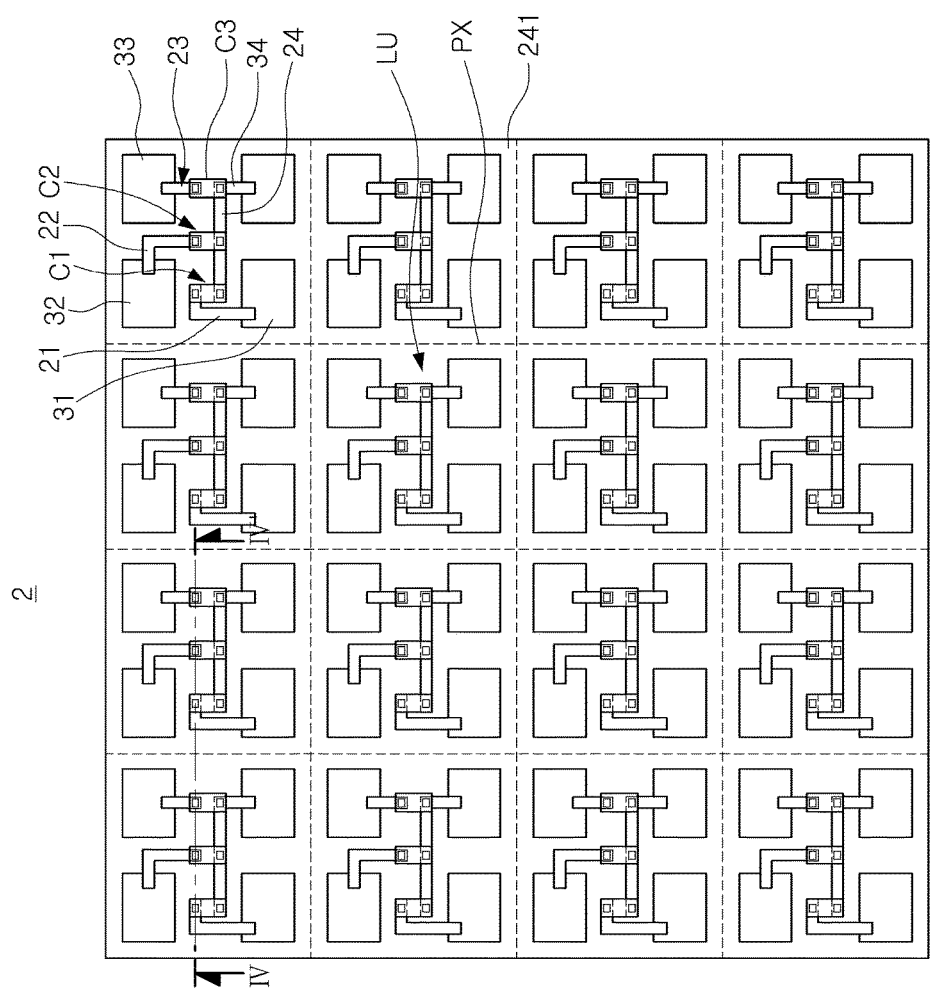
FIG. 15 is a plan view illustrating a light emitting device package, according to an example embodiment.
Figure 16:
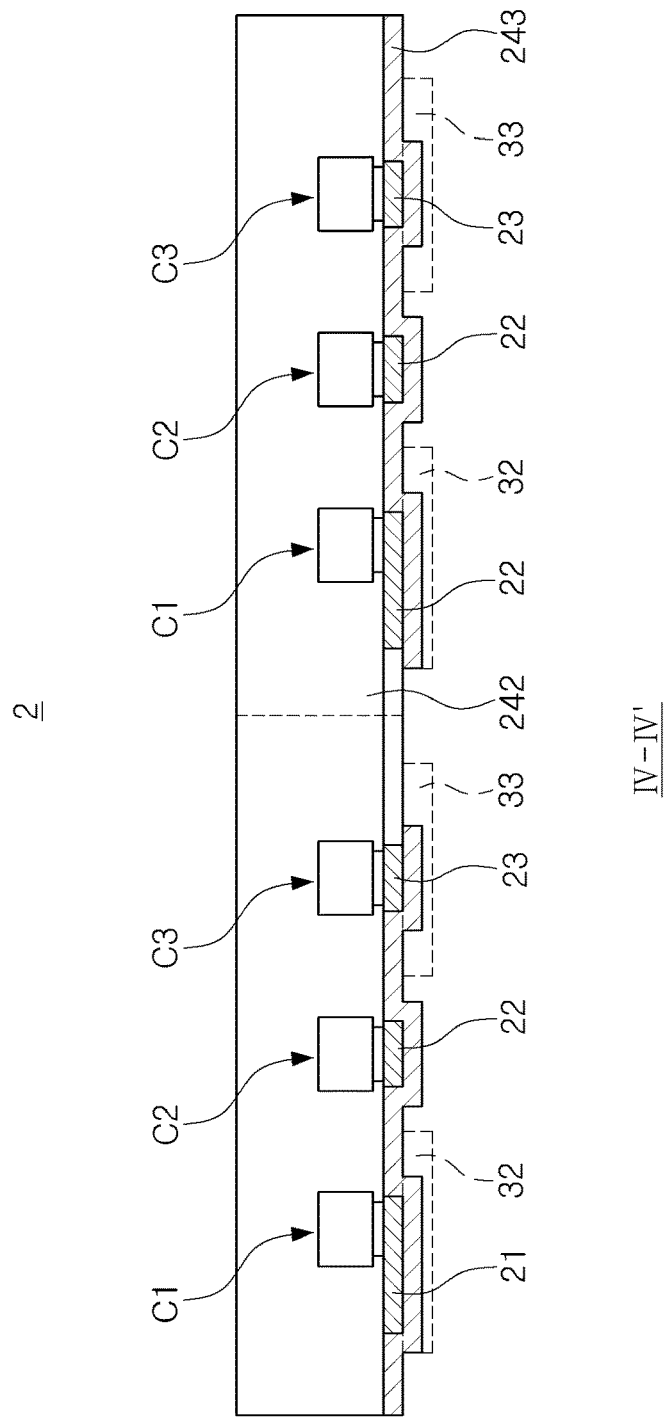
FIG. 16 is a cross-sectional view taken along line IV-IV' of FIG. 15, according to an example embodiment.

FIG. 15 is a plan view illustrating of a light emitting device package 2, according to an example embodiment. FIG. 16 is a cross-sectional view taken along line IV-IV' of FIG. 15.

The light emitting device package 2 may include a plurality of pixel regions PX arranged in an m×n matrix. Here, m and n are integers greater than 1. Each of the pixel regions PX may be referred to a pixel. Structures, corresponding to the light emitting device package 1, described above with reference to FIGS. 1 through 3C, may be arranged in the pixel regions PX. For example, the light emitting device package 2 may include a plurality of pixel regions PX arranged in a 3×4 matrix.

For convenience of description, the remaining components (the first to third light emitting chips C1 to C3, the first to third individual wirings 21 to 23, the common wiring 24, and the first to fourth electrode pads 31 to 34), excluding the molding member 41 and the insulating layer 43 among components of the light emitting device package 1 may be referred as to a light emitting device unit LU.

The light emitting device unit LU may be disposed in the pixel regions PX, and a molding member 241 may be integrally formed as a single member or layer to cover the light emitting device unit LU. The insulating layer 243 may also be integrally formed and disposed on the lower surface of the molding member 241, and may cover the first to third individual wirings 21 to 23 and the common wirings 24.

Each of the pixel regions PX may include a first region having the first to third light emitting chips C1 to C3 arranged therein, and a second region surrounding the first region.

The light emitting device unit LU may include first to third light emitting chips C1 to C3 disposed in the first region included in the pixel region PX, three individual wirings 21 to 23 connected to the first to third light emitting chips C1 to C3, respectively, and a common wiring 24 commonly connected to the first to third light emitting chips C1 to C3, and first to fourth electrode pads 31 to 34 disposed in the second region included in the pixel region PX. The first to fourth electrode pads 31 to 34 may be disposed adjacent to vertexes of the pixel region PX. The three individual wirings 21 to 23 and the common wiring 24 may be disposed on a lower surface of the molding member 241.

The first to third light emitting chips C1 to C3 may be, for example, a red light emitting chip, a green light emitting chip, and a blue light emitting chip, respectively.

Subsequent to the processes illustrated in FIGS. 7A through 7G, the light emitting device packages may be transferred to the dicing tape 16 and then cut to desired dimensions, for example, dimensions including light emitting device units LU disposed in a 3×4 matrix, to fabricate an individual light emitting device package 2, as in the process illustrated in FIG. 7H.

Figure 17:
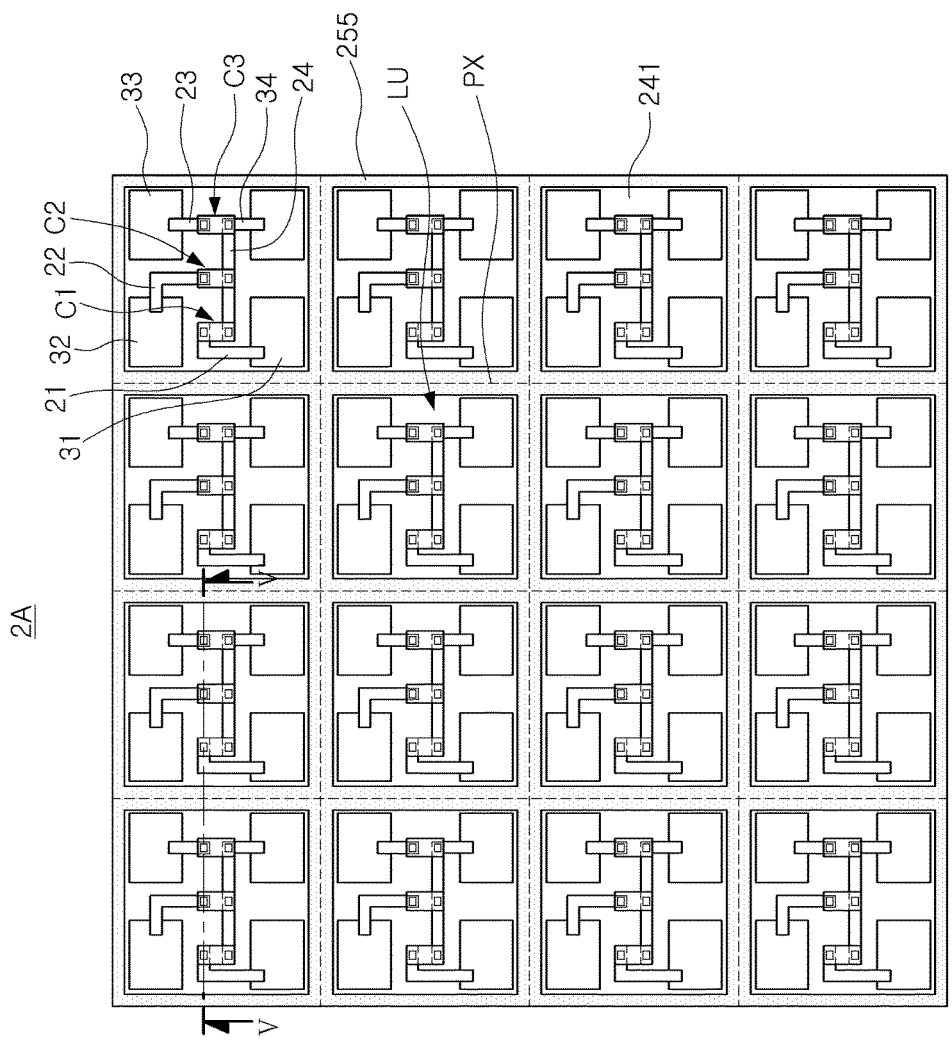
FIG. 17 is a plan view illustrating a light emitting device package, according to an example embodiment.
Figure 18:
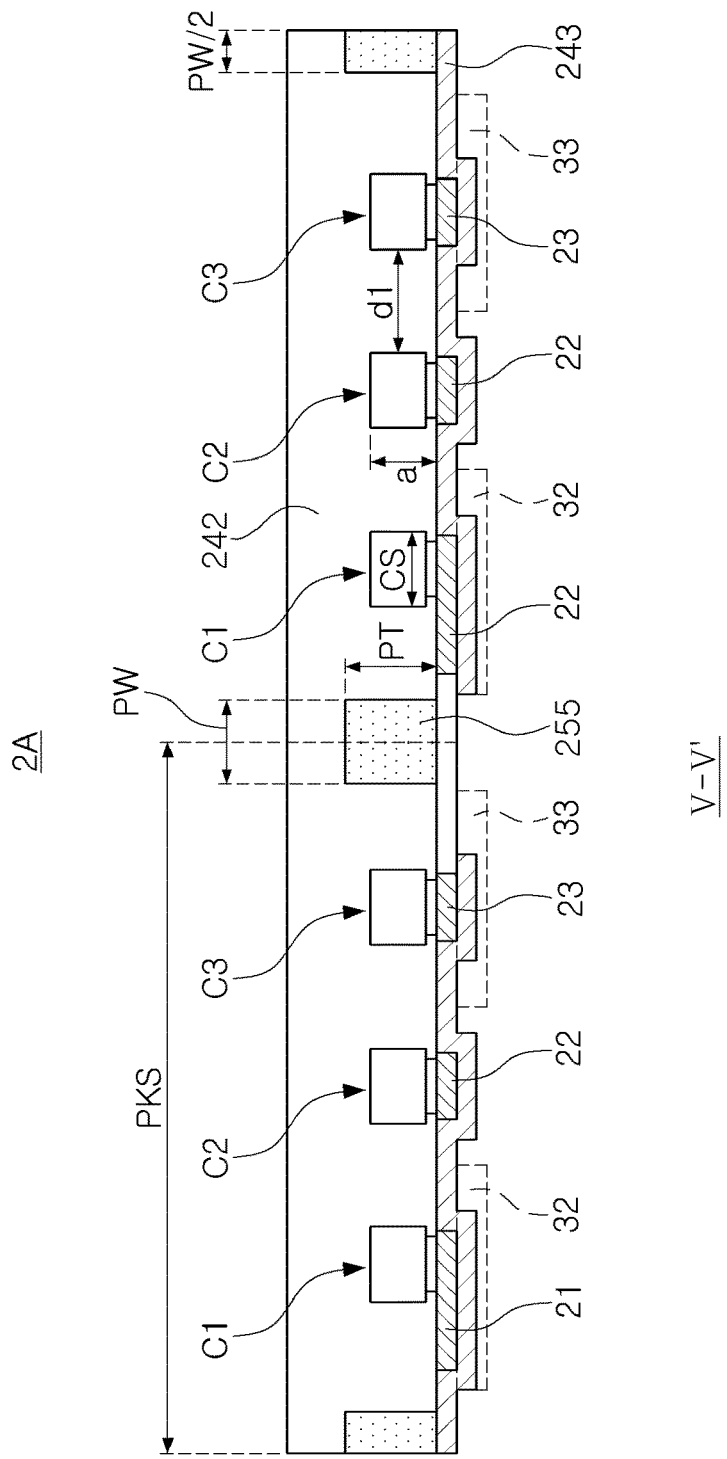
FIG. 18 is a cross-sectional view taken along line V-V' of FIG. 17, according to an example embodiment.

FIG. 17 is a plan view illustrating a light emitting device package 2A, according to an example embodiment. FIG. 18 is a cross-sectional view taken along line V-V' of FIG. 17.

Referring to FIGS. 17 and 18, the light emitting device package 2A may further include a partition structure 255, as compared to the light emitting device package 2.

The partition structure 255 may be disposed between a plurality of light emitting device units LU. The partition structure 255 may be formed of a black resin, such as a black matrix or the like. Further, the partition structure 255 may be a metal structure whose surface is coated with titanium, chromium, or combinations thereof. The metal structure may be formed, for example, of copper, aluminum, a combination thereof, or the like.

The partition structure 255 may have inclined side walls, unlike illustrated in FIGS. 17 and 18. A height PT of the partition structure 255 may be greater than those of the first to third light emitting chips C1 to C3. For example, the height PT of the partition structure 255 may be 80 μm or greater, and a top surface of the partition structure 255 may be smaller than a top surface of the molding member 241. A width PW of the partition structure 255 may be 50 μm or greater, and smaller than a value resulting from an equation "a package length PKS of the light emitting device package 2A-(a light emitting chip length CS×3+a chip spacing d1×2+50 μm)". The smaller the height of the partition structure 255, the greater the angle of beam spread is achieved with respect to the upper surface of each of the light emitting chips C1 to C3. In addition, the greater the height of the partition structure 255, the smaller the angle of beam spread and a color of angle (COA) are. A molding member 241 may cover the partition structure 255.

Figure 19A:
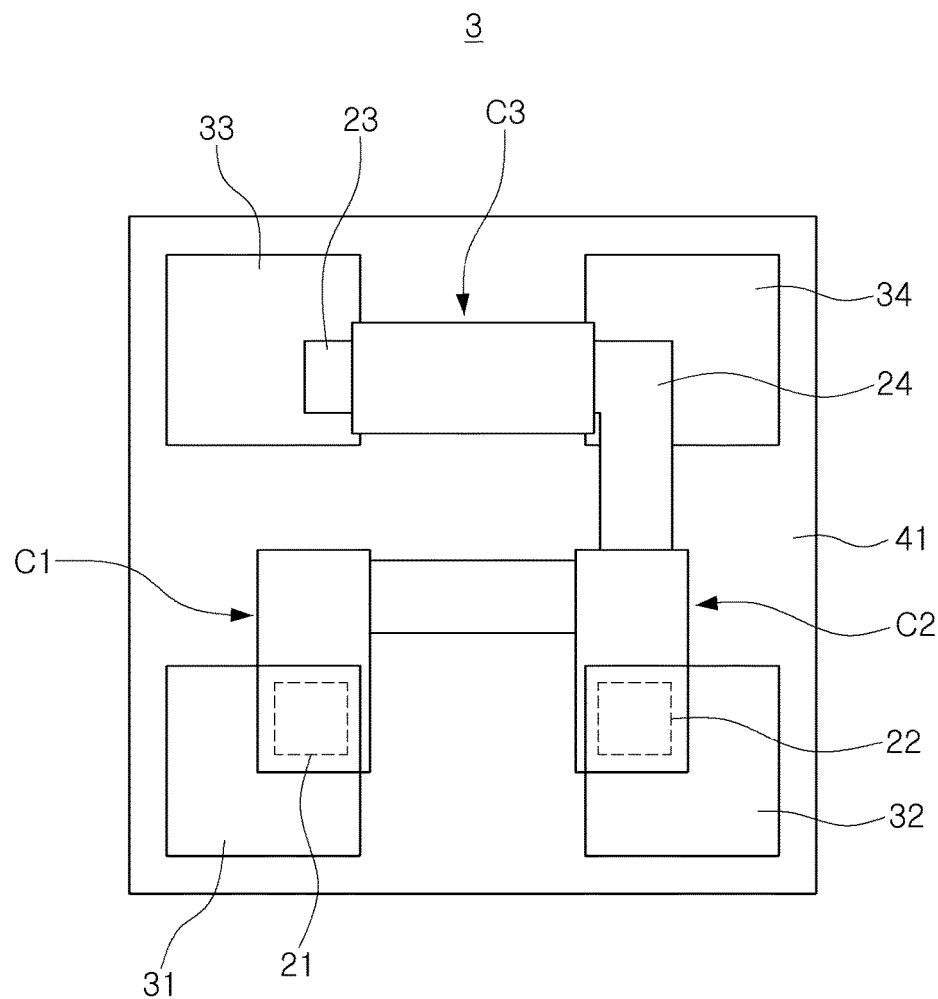
FIGS. 19A and 19B are a plan view and a bottom view respectively illustrating a light emitting device package, according to an example embodiment.
Figure 19B:
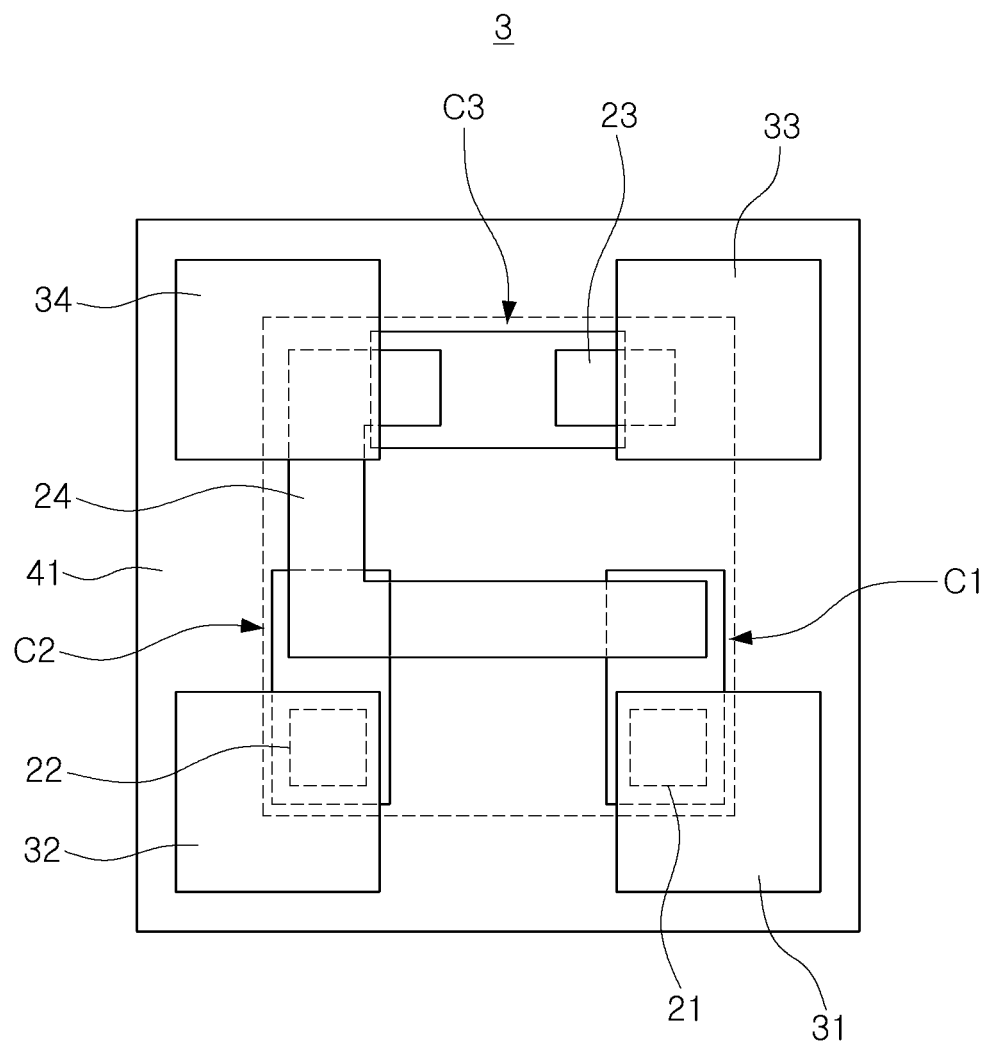

FIGS. 19A and 19B are a plan view and a bottom view respectively illustrating a light emitting device package 3, according to an example embodiment.

Referring to FIGS. 19A and 19B, the light emitting device package 3 may have first to third light emitting chips C1 to C3 having an array different from that of the first to third light emitting chips C1 to C3 included in the light emitting device package 1. The first to third light emitting chips C1 to C3 may be disposed in the form of a triangle, rather than in a row, for miniaturization. The light emitting device package 3 may have dimensions smaller than those of the light emitting device package 1. For example, the light emitting device package 1 may have dimensions of 700 um×700 um, and the light emitting device package 3 may have dimensions of 500 um×500 um. The light emitting device package 3 may be used to implement high definition displays such as 4K ultra-high definition (UHD), 8K UHD, etc. due to fine pitches between a plurality of light emitting device packages.

As the array of the first to third light emitting chips C1 to C3 is modified, shapes of the first to third individual wirings 21 to 23 may be changed, and lengths thereof may be reduced. Further, a shape and length of a common wiring 24 may be modified. Further, dimensions of each of first to fourth electrode pads 31 to 34 may be reduced. For example, unlike in the light emitting device package 1 of FIGS. 2A and 2B, the first to third individual wirings 21 to 23 and the common wiring 24 may be disposed in a first region of a lower surface of a molding member 41 in which the first to third light emitting chips C1 to C3 are arranged.

According to an example embodiment, the first to third light emitting chips C1 to C3 may be arranged in the form of "Y".

Figure 20:
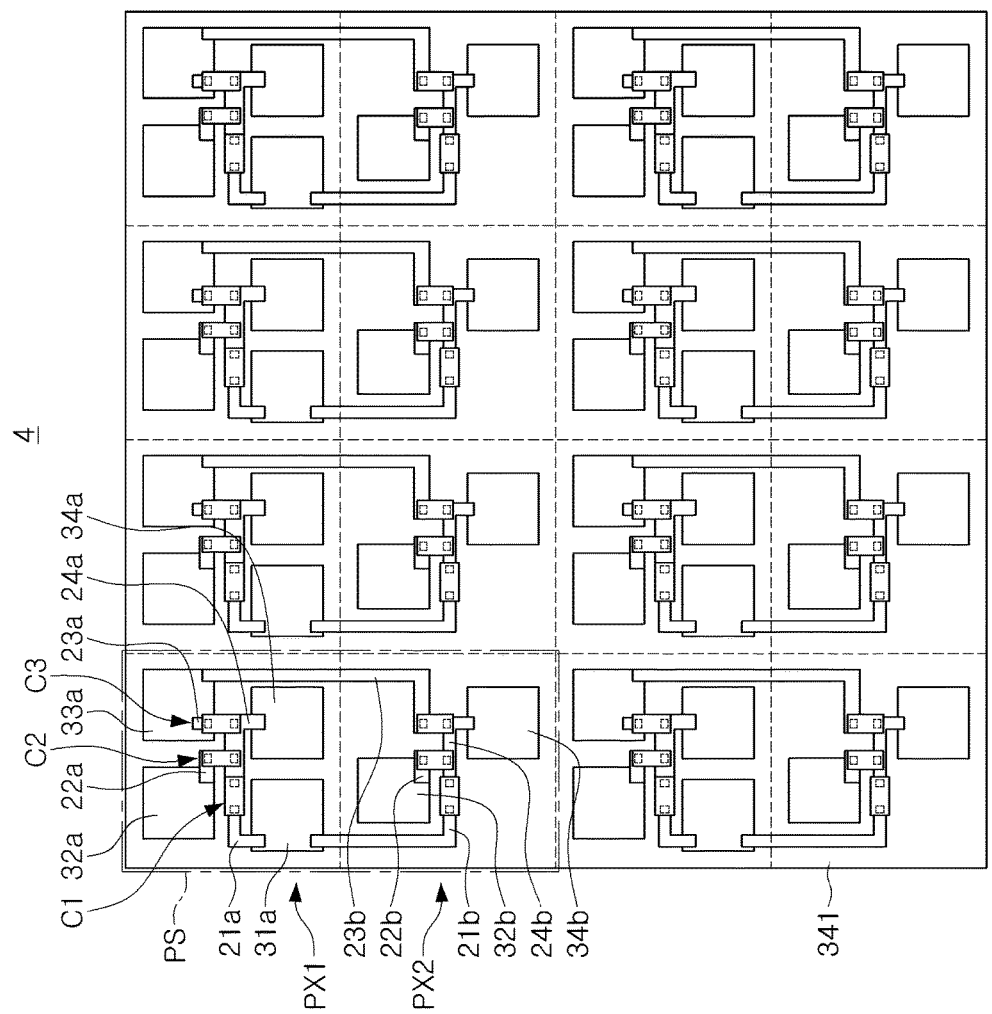
FIG. 20 is a plan view illustrating a light emitting device package, according to an example embodiment.
Figure 21:
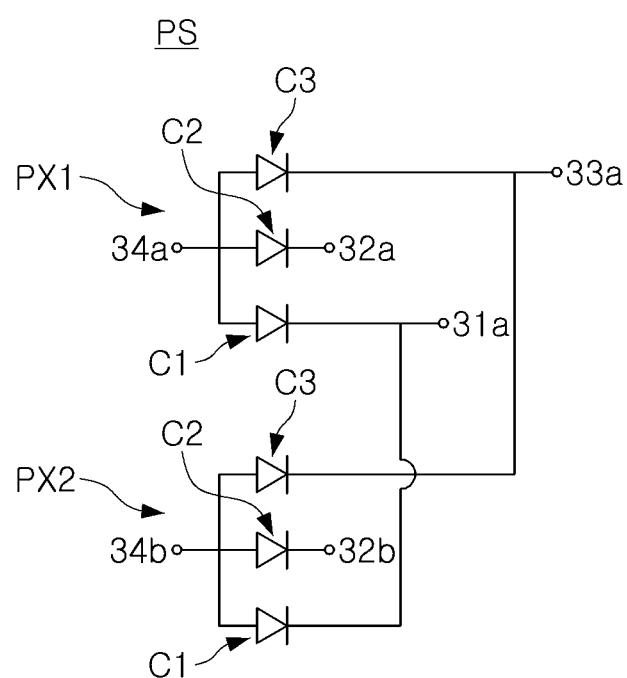
FIG. 21 illustrates a circuit diagram of a pixel set of a light emitting device package, according to an example embodiment.

FIG. 20 is a plan view illustrating a light emitting device package 4, according to an example embodiment. FIG. 21 illustrates a circuit diagram of a pixel set PS formed of two pixel regions PX1 and PX2 of the light emitting device package 4, according to an example embodiment.

Referring to FIGS. 20 and 21, the light emitting device package 4 may include a plurality of pixel regions PX1 and PX2 arranged in an m×m matrix. Here, m is an integer greater than 1. For example, the light emitting device package 4 may take a form of 4×4 matrix. The light emitting device package 4 may be driven in a passive matrix scheme.

Each of the two pixel regions PX1 and PX2 may include a first region having three light emitting chips C1 to C3 arranged therein, and a second region surrounding the first region. In the light emitting device package 4, a pixel set PS of the two pixel regions PX1 and PX2 is repeatedly arranged in a row direction and a column direction. The light emitting chips C1 to C3 may be arranged in a form of "-11" in each of the pixel regions PX1 and PX2 so that one chip, e.g., C1, is rotated by 90° with respect to the other chips, e.g., C2 and C3.

The first pixel region PX1 may include three light emitting chips C1 to C3 disposed in the first region, three individual wirings 21a, 22a and 23a connected to the light emitting chips C1 to C3, respectively, a common wiring 24a commonly connected to the light emitting chips C1 to C3, and electrode pads 31a, 32a, 33a and 34a connected to the individual wirings 21a, 22a, 23a and the common wiring 24a, respectively, and disposed in the second region. The electrode pads 31a, 32a, 33a and 34a may be disposed adjacent to vertexes of the first pixel region PX1. The three individual wirings 21a, 22a, 23a and the common wiring 24a may be disposed on a lower surface of the molding member 341.

The second pixel region PX2 may include light emitting chips C1 to C3 disposed in the first region, three individual wirings 21b, 22b and 23b connected to the light emitting chips C1 to C3, respectively, a common wiring 24b commonly connected to the light emitting chips C1 to C3, and electrode pads 32b and 34b connected to the individual wiring 22b and the common wiring 24b, respectively, and disposed in the second region. The three individual wirings 21b, 22b, 23b and the common wiring 24b may be disposed on a lower surface of the molding member 341.

The first pixel region PX1 may share two electrode pads with the second pixel region PX2 adjacent thereto. The individual wiring 21b connected to the light emitting chip C1 in the second pixel region PX2 may be connected to the electrode pad 31a in the first pixel region PX1. The individual wiring 23b connected to the light emitting chip C3 in the second pixel region PX2 may be connected to the electrode pad 33a in the first pixel region PX1. The electrode pad 31a may be commonly connected to the light emitting chip C1 in the first pixel region PX1 and the light emitting chip C1 in the second pixel region PX2. The electrode pad 33a may be commonly connected to the light emitting chip C3 in the first pixel region PX1 and the light emitting chip C3 in the second pixel region PX2.

The molding member 341 may be integrally formed as a single member or layer to cover upper surfaces and side surfaces of all of the light emitting chips C1 to C3 in the light emitting device package 4. The molding member 341 may be the same as the molding member 41 described above.

The light emitting chips C1 to C3 included in each of the two pixel regions PX1 and PX2 may be a red light emitting chip, a green light emitting chip, and a blue light emitting chip, respectively, not being limited thereto.

The light emitting device package 4, in which neighboring pixel regions share two electrode pads, has a structure in which the number of electrode pads is smaller than the light emitting device package 2 illustrated in FIG. 15, and thus, a size occupied by the electrode pads is decreased. Accordingly, this structure may be used in implementing a light emitting device package with a smaller-sized pixel region. The light emitting device package 4 may also achieve fine pitches between at least the two pixel regions PX1 and PX2 which are required for high definition displays such as 4K ultra-high definition (UHD), 8K UHD, etc.

According to an example embodiment, unlike in FIG. 20, one light emitting device package may be formed of only one pixel set PS.

Figure 22:
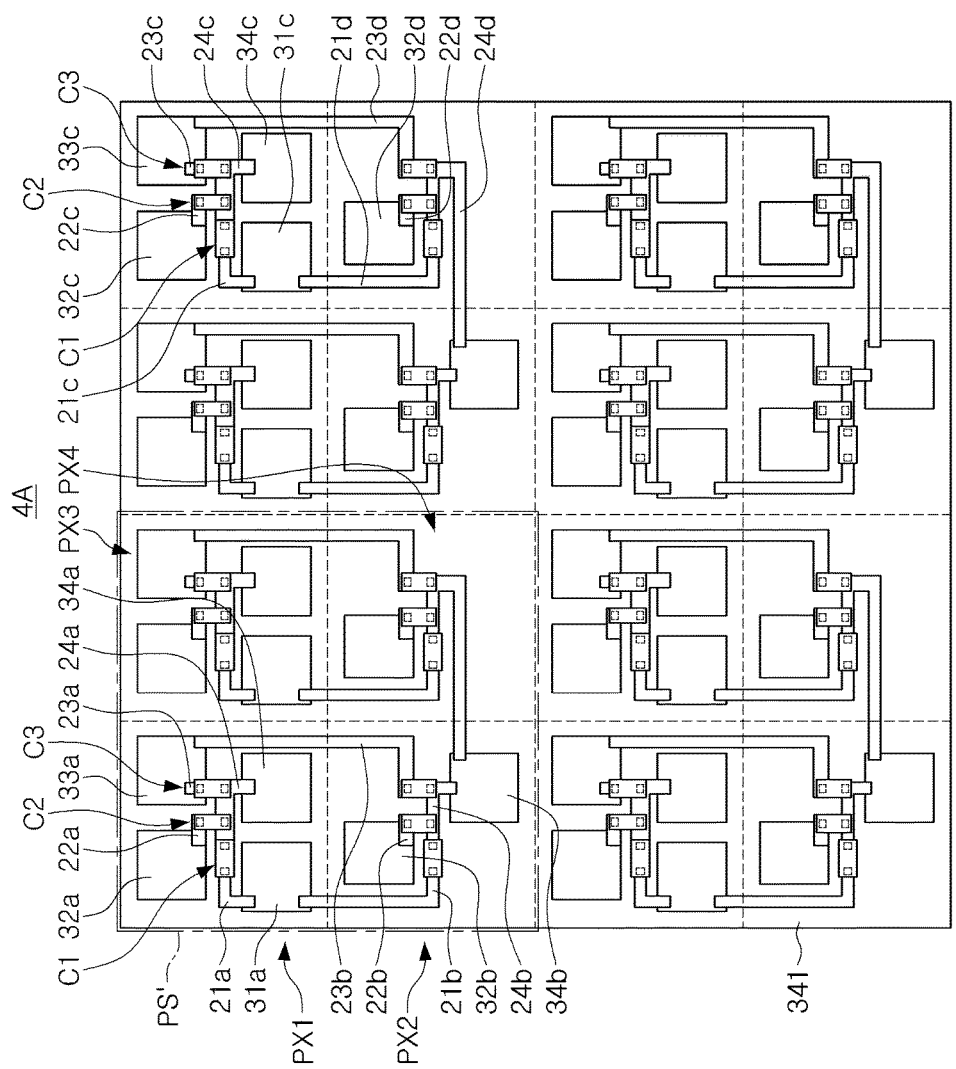
FIG. 22 is a plan view illustrating a light emitting device package, according to an example embodiment.
Figure 23:
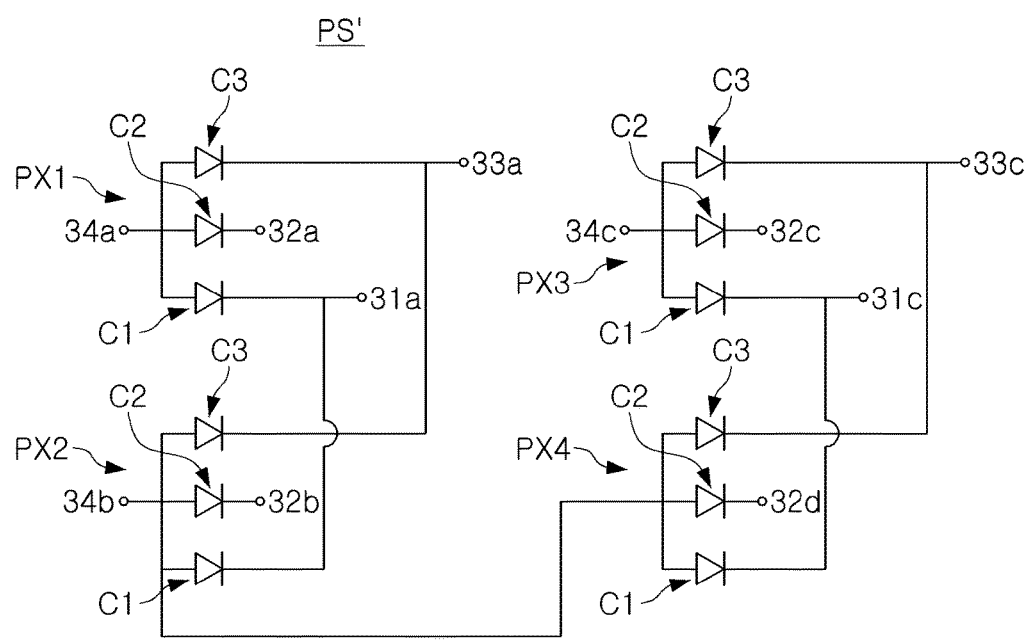
FIG. 23 illustrates a circuit diagram of a pixel set of a light emitting device package, according to an example embodiment.

FIG. 22 is a plan view illustrating a light emitting device package 4A, according to an example embodiment. FIG. 23 illustrates a circuit diagram of a pixel set PS' formed of four pixel regions PX1 to PX4 of the light emitting device package 4A, according to an example embodiment.

Referring to FIGS. 22 and 23, the light emitting device package 4A may include a plurality of pixel regions PX1, PX2, PX3 and PX4 arranged in an m×m matrix. Here, m is an integer greater than 1. For example, the light emitting device package 4A may take a form of 4×4 matrix. The light emitting device package 4A may be driven in a passive matrix scheme.

Each of the four pixel regions PX1, PX2, PX3 and PX4 may include a first region having three light emitting chips C1 to C3 arranged therein, and a second region surrounding the first region. In the light emitting device package 4A, a pixel set PS' including the four pixel regions PX1, PX2, PX3 and PX4 is repeatedly arranged in a row direction and a column direction. The light emitting chips C1 to C3 may be arranged in a form of "-11" in each of the pixel regions PX1 to PX4 so that one chip, e.g., C1, is rotated by 90° with respect to the other chips, e.g., C2 and C3.

The first pixel region PX1 may include three light emitting chips C1 to C3 disposed in the first region, three individual wirings 21a, 22a and 23a connected to the light emitting chips C1 to C3, respectively, a common wiring 24a commonly connected to the light emitting chips C1 to C3, and electrode pads 31a, 32a, 33a and 34a connected to the individual wirings 21a, 22a, 23a and the common wiring 24a, respectively, and disposed in the second region. The electrode pads 31a, 32a, 33a and 34a may be disposed adjacent to vertexes of the first pixel region PX1. The three individual wirings 21a, 22a, 23a and the common wiring 24a may be disposed on a lower surface of the molding member 341.

The second pixel region PX2 may include light emitting chips C1 to C3 disposed in the first region, three individual wirings 21b, 22b and 23b connected to the light emitting chips C1 to C3, respectively, a common wiring 24b commonly connected to the light emitting chips C1 to C3, and electrode pads 32b and 34b connected to the individual wiring 22b and the common wiring 24b, respectively, and disposed in the second region. The three individual wirings 21b, 22b, 23b and the common wiring 24b may be disposed on a lower surface of the molding member 341.

The first pixel region PX1 may share two electrode pads with the second pixel region PX2 adjacent thereto. The individual wiring 21b connected to the light emitting chip C1 in the second pixel region PX2 may be connected to the electrode pad 31a in the first pixel region PX1. The individual wiring 23b connected to the light emitting chip C3 in the second pixel region PX2 may be connected to the electrode pad 33a in the first pixel region PX1. The electrode pad 31a may be commonly connected to the light emitting chip C1 in the first pixel region PX1 and the light emitting chip C1 in the second pixel region PX2. The electrode pad 33a may be commonly connected to the light emitting chip C3 in the first pixel region PX1 and the light emitting chip C3 in the second pixel region PX2.

The third pixel region PX3 may include three light emitting chips C1 to C3 disposed in the first region, three individual wirings 21c, 22c and 23c connected to the light emitting chips C1 to C3, respectively, a common wiring 24c commonly connected to the light emitting chips C1 to C3, and electrode pads 31c, 32c, 33c and 34c connected to the individual wirings 21c, 22c, 23c and the common wiring 24c, respectively, and disposed in the second region. The electrode pads 31c, 32c, 33c and 34c may be disposed adjacent to vertexes of the third pixel region PX3. The three individual wirings 21c, 22c, 23c and the common wiring 24c may be disposed on a lower surface of the molding member 341.

The fourth pixel region PX4 may include light emitting chips C1 to C3 disposed in the first region, three individual wirings 21d, 22d and 23d connected to the light emitting chips C1 to C3, respectively, a common wiring 24d commonly connected to the light emitting chips C1 to C3, and an electrode pad 32d connected to the individual wiring 22d, and disposed in the second region. The three individual wirings 21d, 22d, 23d and the common wiring 24d may be disposed on a lower surface of the molding member 341.

The third pixel region PX3 may share two electrode pads with the fourth pixel region PX4 adjacent thereto. The individual wiring 21d connected to the light emitting chip C1 in the fourth pixel region PX4 may be connected to the electrode pad 31c in the third pixel region PX3. The individual wiring 23d connected to the light emitting chip C3 in the fourth pixel region PX4 may be connected to the electrode pad 33c in the third pixel region PX3. The electrode pad 31c may be commonly connected to the light emitting chip C1 in the third pixel region PX3 and the light emitting chip C1 in the fourth pixel region PX4. The electrode pad 33c may be commonly connected to the light emitting chip C3 in the third pixel region PX3 and the light emitting chip C3 in the fourth pixel region PX4.

The second pixel region PX2 may share one electrode pad with the fourth pixel region PX4 adjacent thereto. The common wiring 24d connected to the light emitting chips C1 to c3 in the fourth pixel region PX4 may be connected to the electrode pad 34b in the second pixel region PX2. The electrode pad 34b is commonly connected to the light emitting chips C1 to C3 in the second pixel region PX2 and the light emitting chips C1 to C3 in the fourth pixel region PX4.

The molding member 341 may be integrally formed as a single member or layer to cover upper surfaces and side surfaces of all of the light emitting chips C1 to C3 in the light emitting device package 4A. The molding member 341 may be the same as the molding member 41 described above.

The light emitting chips C1 to C3 included in each of the four pixel regions PX1, PX2, PX3 and PX4 may be a red light emitting chip, a green light emitting chip, and a blue light emitting chip, respectively, not being limited thereto.

The light emitting device package 4A, in which neighboring pixel regions share two electrode pads, has a structure in which the number of electrode pads is smaller than the light emitting device package 2 illustrated in FIG. 15, and thus, a size occupied by the electrode pads is decreased. Accordingly, this structure may be used in implementing a light emitting device package with a smaller-sized pixel region. The light emitting device package 4A may achieve fine pitches between at least the four pixel regions PX1, PX2, PX3 and PX4 which are required for high definition displays such as 4K ultra-high definition (UHD), 8K UHD, etc.

According to an example embodiment, unlike in FIG. 22, a light emitting device package may be formed of only one pixel set PS'.

Figure 24:
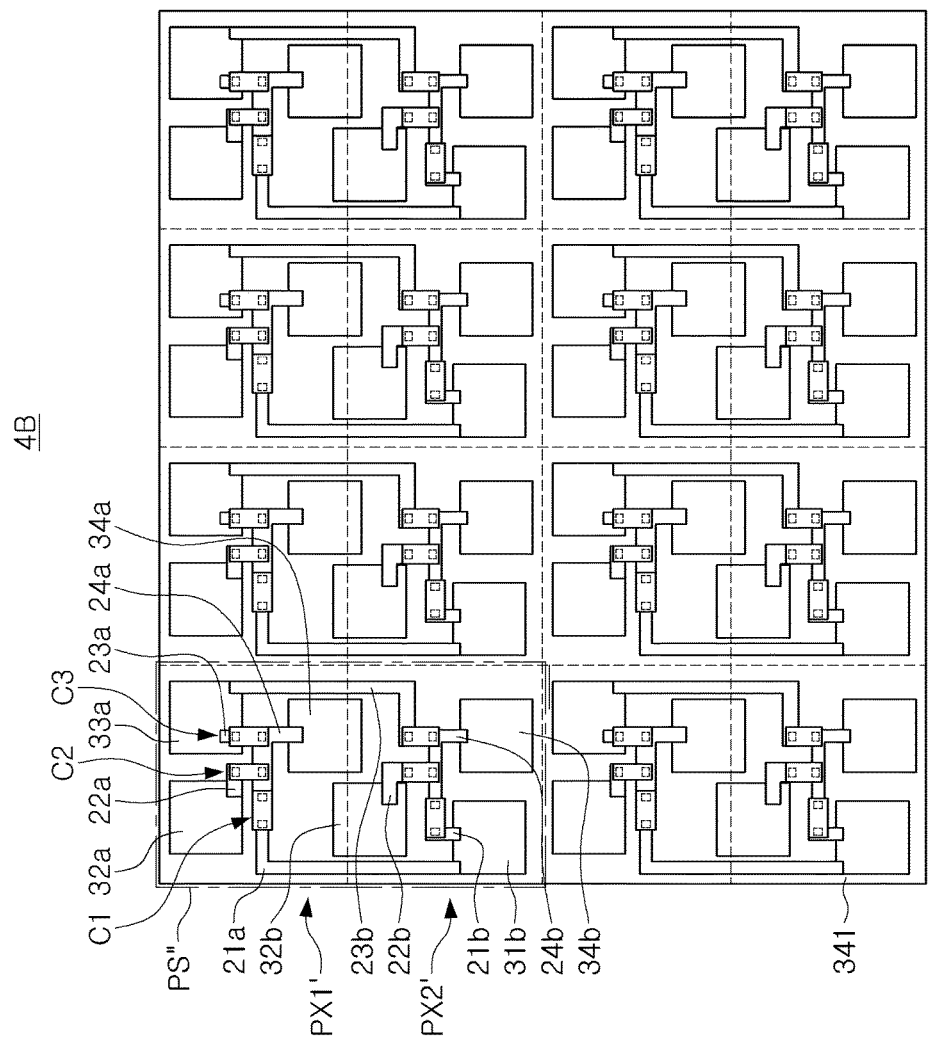
FIG. 24 is a plan view illustrating a light emitting device package, according to an example embodiment.
Figure 25:
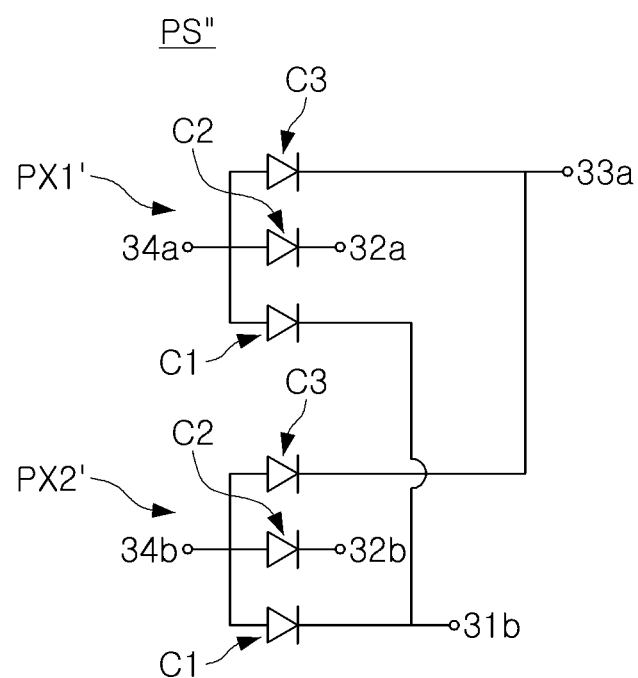
FIG. 25 illustrates a circuit diagram of a pixel set of a light emitting device package, according to an example embodiment.

FIG. 24 is a plan view illustrating a light emitting device package 4B, according to an example embodiment. FIG. 25 illustrates a circuit diagram of a pixel set PS" formed of two pixel regions PX1' and PX2' of the light emitting device package 4B, according to an example embodiment.

In FIGS. 24 and 25, compared to the light emitting device package 4 of FIG. 20, the light emitting device package 4B has a different electrode pad structure in the two pixel regions PX1' and PX2'. Hereinafter, differences of the light emitting device package 4B will be described, and redundant descriptions will be omitted.

Each pixel set PS" may include the two pixel regions PX1' and PX2'.

The first pixel region PX1' may include three individual wirings 21a, 22a and 23a connected to the light emitting chips C1 to C3, respectively, a common wiring 24a commonly connected to the light emitting chips C1 to C3, and three electrode pads 32a, 33a and 34a connected to the individual wirings 22a, 23a and the common wiring 24a, respectively. The electrode pad 34a is disposed over a border of the two pixel regions PX1' and PX2', so that a portion of the electrode pad 34a is disposed in the second pixel region PX2'.

The second pixel region PX2' may include three individual wirings 21b, 22b and 23b connected to the light emitting chips C1 to C3, respectively, a common wiring 24b commonly connected to the light emitting chips C1 to C3, and three electrode pads 31b, 32b and 34b connected to the individual wiring 21b, 22b and the common wiring 24b, respectively. The electrode pad 32b is disposed over a border of the two pixel regions PX1' and PX2', so that a portion of the electrode pad 32b is disposed in the first pixel region PX1'.

The first pixel region PX1' may share two electrode pads with the second pixel region PX2' adjacent thereto. The individual wiring 21a connected to the light emitting chip C1 in the first pixel region PX1' may be connected to the electrode pad 31b in the second pixel region PX2'. The individual wiring 23b connected to the light emitting chip C3 in the second pixel region PX2' may be connected to the electrode pad 33a in the first pixel region PX1'. The electrode pad 31b may be commonly connected to the light emitting chip C1 in the first pixel region PX1' and the light emitting chip C1 in the second pixel region PX2'. The electrode pad 33a may be commonly connected to the light emitting chip C3 in the first pixel region PX1' and the light emitting chip C3 in the second pixel region PX2'.

The light emitting device package 4B, in which neighboring pixel regions share a plurality of electrode pads, has a structure in which the number of electrode pads is smaller than the light emitting device package 2 illustrated in FIG. 15, and thus, a size occupied by the electrode pads is decreased. Accordingly, this structure may be used in implementing a light emitting device package with a smaller-sized pixel region. The light emitting device package 4B may also achieve fine pitches between at least the two pixel regions PX1' and PX2' which are required for high definition displays such as 4K ultra-high definition (UHD), 8K UHD, etc.

According to an example embodiment, unlike in FIG. 24, one light emitting device package may be formed of only one pixel set PS".

Figure 26:
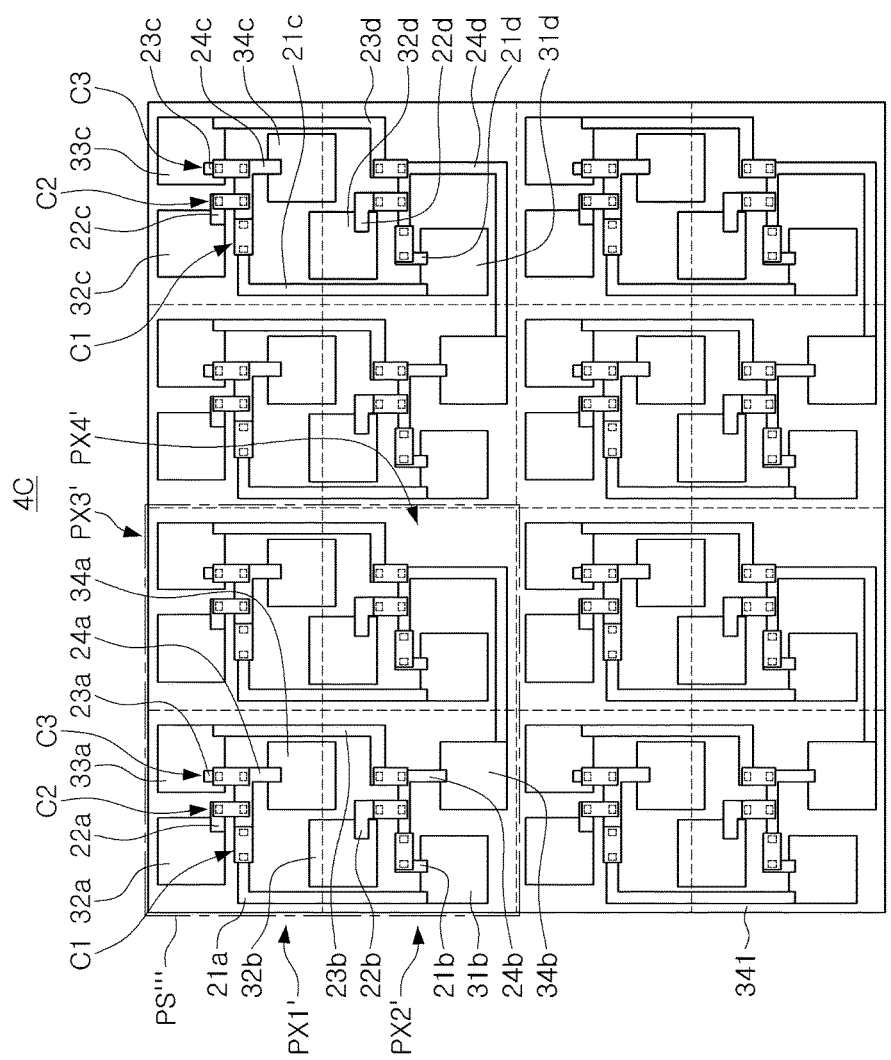
FIG. 26 is a plan view illustrating a light emitting device package, according to an example embodiment.
Figure 27:
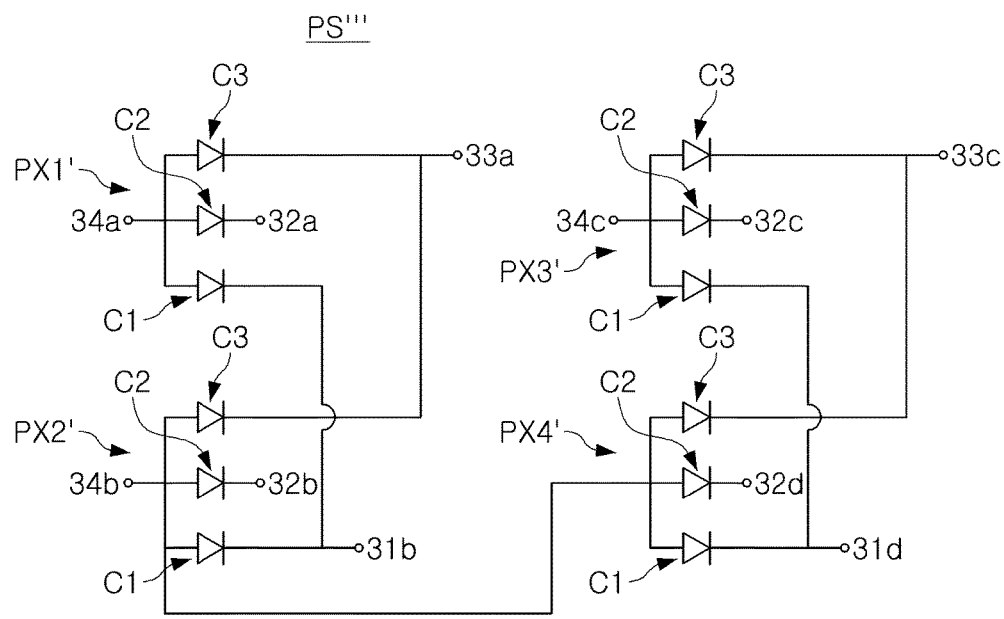
FIG. 27 illustrates a circuit diagram of a pixel set of a light emitting device package, according to an example embodiment.

FIG. 26 is a plan view illustrating a light emitting device package 4C, according to an example embodiment. FIG. 27 illustrates a circuit diagram of a pixel set PS'" formed of four pixel regions PX1' to PX4' of the light emitting device package 4C, according to an example embodiment.

In FIGS. 26 and 27, compared to the light emitting device package 4A of FIG. 22, the light emitting device package 4C has a different electrode pad structure in the four pixel regions PX1' to PX4'. Hereinafter, differences of the light emitting device package 4C will be described, and redundant descriptions will be omitted.

Each pixel set PS'" may include the four pixel regions PX1' to PX4'.

The first pixel region PX1' may include three individual wirings 21a, 22a and 23a connected to the light emitting chips C1 to C3, respectively, a common wiring 24a commonly connected to the light emitting chips C1 to C3, and electrode pads 32a, 33a and 34a connected to the individual wirings 22a, 23a and the common wiring 24a, respectively. The electrode pad 34a is disposed over a border of the two pixel regions PX1' and PX2', so that a portion of the electrode pad 34a is disposed in the second pixel region PX2'.

The second pixel region PX2' may include three individual wirings 21b, 22b and 23b connected to the light emitting chips C1 to C3, respectively, a common wiring 24b commonly connected to the light emitting chips C1 to C3, and electrode pads 31b, 32b and 34b connected to the individual wirings 21b, 22b and the common wiring 24b, respectively. The electrode pad 32b is disposed over a border of the two pixel regions PX1' and PX2', so that a portion of the electrode pad 32b is disposed in the first pixel region PX1'.

The first pixel region PX1' may share two electrode pads with the second pixel region PX2' adjacent thereto. The individual wiring 21a connected to the light emitting chip C1 in the first pixel region PX1' may be connected to the electrode pad 31b in the second pixel region PX2. The individual wiring 23b connected to the light emitting chip C3 in the second pixel region PX2' may be connected to the electrode pad 33a in the first pixel region PX1'. The electrode pad 31b may be commonly connected to the light emitting chip C1 in the first pixel region PX1' and the light emitting chip C1 in the second pixel region PX2'. The electrode pad 33a may be commonly connected to the light emitting chip C3 in the first pixel region PX1' and the light emitting chip C3 in the second pixel region PX2'.

The third pixel region PX3' may include three individual wirings 21c, 22c and 23c connected to the light emitting chips C1 to C3, respectively, a common wiring 24c commonly connected to the light emitting chips C1 to C3, and electrode pads 32c, 33c and 34c connected to the individual wirings 22c, 23c and the common wiring 24c, respectively. The electrode pad 34c is disposed over a border of the two pixel regions PX3' and PX4', so that a portion of the electrode pad 34c is disposed in the fourth pixel region PX4'.

The fourth pixel region PX4' may include three individual wirings 21d, 22d and 23d connected to the light emitting chips C1 to C3, respectively, a common wiring 24d commonly connected to the light emitting chips C1 to C3, and two electrode pads 31d and 32d connected to the individual wiring 21d and 22d, respectively. The electrode pad 32d is disposed over a border of the two pixel regions PX3' and PX4', so that a portion of the electrode pad 32d is disposed in the third pixel region PX3'.

The third pixel region PX3' may share two electrode pads with the fourth pixel region PX4' adjacent thereto. The individual wiring 21c connected to the light emitting chip C1 in the third pixel region PX3' may be connected to the electrode pad 31d in the fourth pixel region PX4'. The individual wiring 23d connected to the light emitting chip C3 in the fourth pixel region PX4' may be connected to the electrode pad 33c in the third pixel region PX3'. The electrode pad 31d may be commonly connected to the light emitting chip C1 in the third pixel region PX3' and the light emitting chip C1 in the fourth pixel region PX4'. The electrode pad 33c may be commonly connected to the light emitting chip C3 in the third pixel region PX3' and the light emitting chip C3 in the fourth pixel region PX4'.

The second pixel region PX2' may share one electrode pad with the fourth pixel region PX4' adjacent thereto. The common wiring 24d connected to the light emitting chips C1 to c3 in the fourth pixel region PX4' may be connected to the electrode pad 34b in the second pixel region PX2'. The electrode pad 34b is commonly connected to the light emitting chips C1 to C3 in the second pixel region PX2' and the light emitting chips C1 to C3 in the fourth pixel region PX4'.

The light emitting device package 4C, in which neighboring pixel regions share a plurality of electrode pads, has a structure in which the number of electrode pads is smaller than the light emitting device package 2 illustrated in FIG. 15, and thus, a size occupied by the electrode pads is decreased. Accordingly, this structure may be used in implementing a light emitting device package with a smaller-sized pixel region. The light emitting device package 4C may achieve fine pitches between at least the four pixel regions PX1', PX2', PX3' and PX4' which are required for high definition displays such as 4K ultra-high definition (UHD), 8K UHD, etc.

According to an example embodiment, unlike in FIG. 26, one light emitting device package may be formed of only one pixel set PS'''.

FIGS. 28A through 28D are cross-sectional views illustrating a method of manufacturing a plurality of light emitting device packages, according to an example embodiment. For convenience of understanding, however, the manufacturing method may be described with respect to one light emitting device package.

Figure 28A:
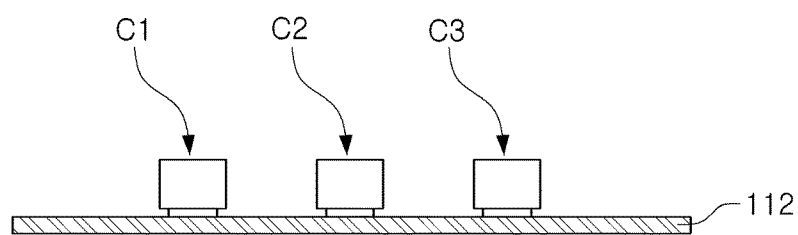
FIGS. 28A through 28D are cross-sectional views illustrating a method of manufacturing a plurality of light emitting device packages, according to an example embodiment.

Referring to FIG. 28A, light emitting chips C1 to C3 may be attached to a first adhesive tape 112 at a desired order and desired intervals. The light emitting chips C1 to C3 may emit light having different wavelengths. The first adhesive tape 112 may be, for example, a thermal release tape or an ultraviolet (UV) release tape, not being limited thereto.

Figure 28B:
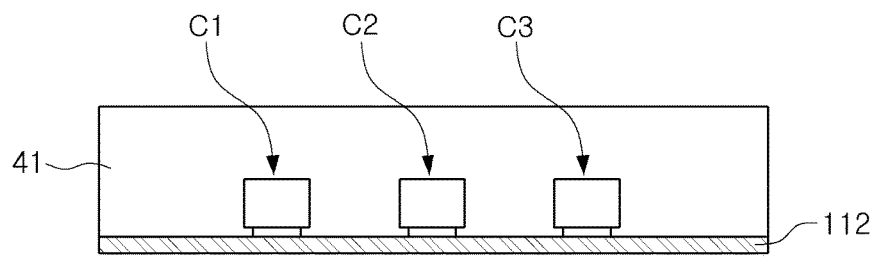

Referring to FIG. 28B, a molding member 41 may be integrally formed as a single member or layer to entirely cover the light emitting chips C1 to C3. The molding member 41 may be formed using, for example, a coating process and a curing process, and may include a predetermined amount of carbon black.

Figure 28C:
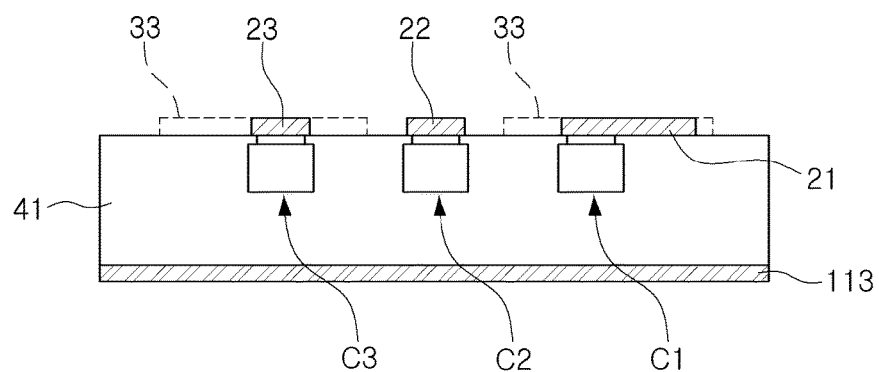

Referring to FIG. 28C, a second adhesive tape 113 may be attached to an upper surface of the molding member 41, and the first adhesive tape 112 may be removed. Adhesive strength of the second adhesive tape 113 may be greater than that of the first adhesive tape 112. The second adhesive tape 113 may be, for example, a thermal release tape or an ultraviolet (UV) release tape, not being limited thereto. After the first adhesive tape 112 is removed, first and second electrodes of each of the light emitting chips C1 to C3 may be exposed through a surface of the molding member 41.

Individual wirings 21 to 23, a common wiring 24, and electrode pads 31 to 34 may be formed, preferably but not necessarily in a simultaneous manner, at a bottom of the light emitting chips C1 to C3 where the first adhesive tape 112 is removed by using a printing technique. Selective spaces between the individual wirings 21 to 23, the common wiring 24, and the electrode pads 31 to 34 may be filled with an insulation material.

Figure 28D:
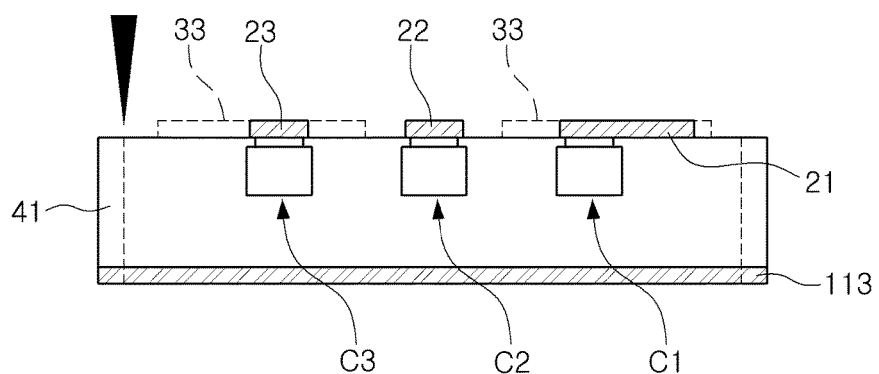

Referring to FIG. 28D, by using a blade or laser, a light emitting device package, for example, as illustrated in FIG. 15, 17, 20 or 21, may be obtained.

Figure 29:
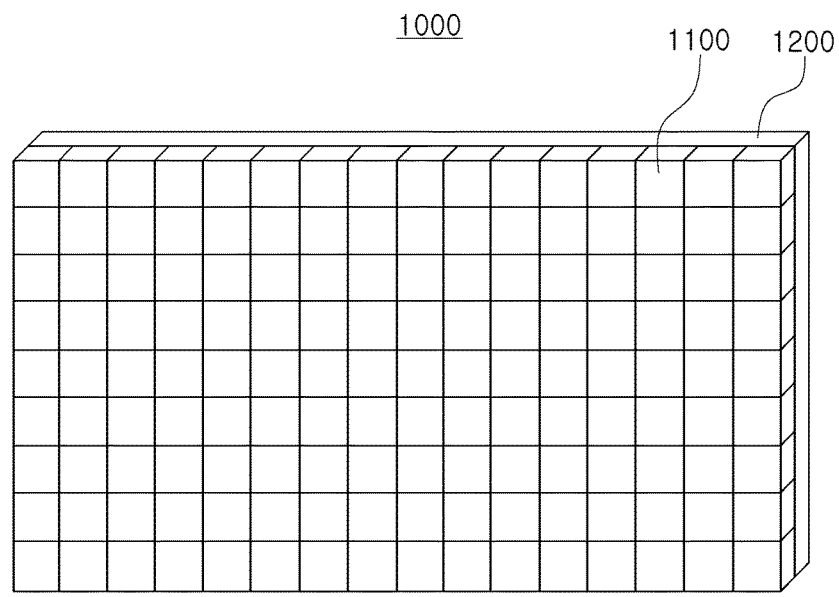
FIG. 29 is a schematic perspective view illustrating a display panel including a light emitting device package, according to an example embodiment.

FIG. 29 is a schematic perspective view illustrating a display panel 1000 including a light emitting device package, according to an example embodiment.

Referring to FIG. 29, the display panel 1000 may include a circuit board 1200, and a plurality of pixels 1100 mounted on the circuit board 1200 in a matrix. FIG. 29 illustrates the pixels 1100 arranged in a 9×16 matrix, but this is only an example. The number of mounted pixels 1100 may be modified according to resolutions and dimensions of the display panel 1000. The light emitting device package 1, 1A, 1B, 1C, 2, 2A, 3, 4, 4A, 4B or 4C according to the above example embodiments, may form the pixels 1100. When the light emitting device package 1, 1A, 1B, 1C, 2, 2A, 3, 4, 4A, 4B or 4C is employed in example embodiments, the number of times surface mount technology (SMT) processes are used to fabricate the display panel 1000 may be reduced, and a time required for the SMT process may be shortened. The first to third light emitting chips C1 to C3 included in the light emitting device package 1, 1A, 1B, 1C, 2, 2A, 3, 4, 4A, 4B or 4C may form subpixels of the display panel 1000.

The circuit board 1200 may include a driving circuit (a thin film transistor (TFT) array or the like) configured to independently drive the subpixels (for example, red, green, and blue (RGB) subpixels) of the display panel 1000.

The display panel 1000 may further include a protective layer protecting the pixels 1100 from the outside. The display panel 1000 may further include a polarizing layer adjusting an orientation of light emitted from the pixels 1100 to display a clear and vivid image.

Figure 30:
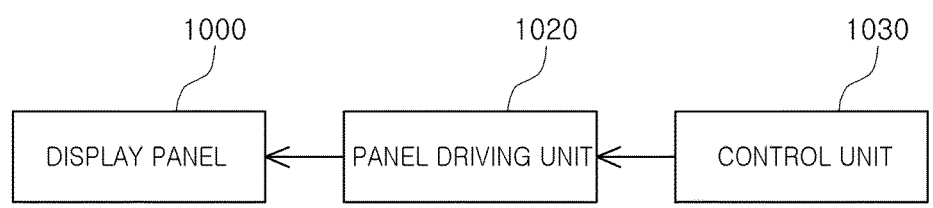
FIG. 30 is a block diagram illustrating a configuration of a display device, according to an example embodiment.

FIG. 30 is a block diagram illustrating a configuration of a display device, according to an example embodiment.

Referring to FIG. 30, the display panel 1000 illustrated in FIG. 29 may form a display device along with a panel driving unit 1020 and a control unit 1050. The display device may be implemented as displays of various electronic devices, such as an electronic display board, a video wall, a television, an electronic blackboard, an electronic table, a large format display (LFD), a smartphone, a tablet personal computer (PC), a desktop PC, and a laptop PC.

The panel driving unit 1020 may drive the display panel 1000, and the control unit 1050 may control the panel driving unit 1020. The panel driving unit 1020, controlled by the control unit 1050, may be configured to independently turn on/off each of the RGB subpixels.

For example, the panel driving unit 1020 may transmit a clock signal having a particular driving frequency to each RGB subpixel to turn on/off each RGB subpixel. The control unit 1050 may control the panel driving unit 1020, such that the RGB subpixels may be turned on in set group units, in response to an input image signal, thus displaying a desired image on the display panel 1000.

As set forth above, according to example embodiments of the present inventive concept, a compact easy-to-mount light emitting device package, with which various colors of light may be implemented, may be provided.

While example embodiments have been shown and described above, it will be apparent to those skilled in the art that modifications and variations could be made without departing from the scope of the present inventive concept, as defined by the appended claims.

What is claimed is:

1. A light emitting device package comprising:
a plurality of light emitting chips configured to emit respective wavelength lights, each chip comprising electrodes at a bottom of the chip to form a flip-chip structure;
a plurality of wirings directly connected to the electrodes of the chips, respectively;
a plurality of electrode pads disposed below the chips and directly connected to the wirings, respectively; and
a molding member integrally formed in a single layer structure to cover upper surfaces and side surfaces of the chips, and comprising a translucent material having a predetermined transmittance,
wherein the wirings are disposed below a lower surface of the molding member.

2. The light emitting device package of claim 1, wherein adjacent two chips among the chips are spaced apart by 50 μm or greater, and
wherein the electrode pads are disposed adjacent to vertexes of the lower surface of the molding member, and spaced apart from side surfaces of the molding member by 220 μm or less.

3. The light emitting device package of claim 2, wherein the wirings comprise:
a plurality of individual wirings respectively connected to first electrodes of the chips; and
a common wiring commonly connected to second electrodes of the chips.

4. The light emitting device package of claim 3, further comprising an insulating layer layered on the lower surface of the molding member to cover the wirings,
wherein the insulating layer has openings through which the electrode pads are directly connected to the wirings, respectively.

5. The light emitting device package of claim 1, wherein the molding member has different transmittances for different wavelength lights.

6. The light emitting device package of claim 5, wherein the molding member has a transmittance of 30% or greater and 89% or less with respect to light having a wavelength of 530 nm.

7. The light emitting device package of claim 1, wherein the molding member comprises carbon black of 0.04 wt % or greater and 0.2 wt % or less.

8. The light emitting device package of claim 1, wherein the molding member comprises carbon black and an inorganic filler, and
wherein the inorganic filler comprises at least one of a fused silica material and a silicon dioxide material.

9. The light emitting device package of claim 1, wherein an upper surface of the molding member has an uneven structure.

10. The light emitting device package of claim 1, wherein the molding member has an upper thickness of 10 μm or greater and 120 μm or less measured from respective upper surfaces of the chips.

11. The light emitting device package of claim 10, wherein each of the chips has a beam angle of 160° or greater.

12. A light emitting device package comprising:
a plurality of light emitting chips configured to emit respective wavelength lights, each chip comprising electrodes at a bottom of the chip;
a plurality of wirings connected to the electrodes of the chips, respectively;
a plurality of electrode pads disposed below the chips, and connected to the wirings, respectively;
a molding member integrally formed in a single layer structure to cover upper surfaces and side surfaces of the chips, and comprising a material having a predetermined transmittance; and
at least one of a metal layer disposed above the molding member, a colored lower layer disposed below the molding member, and a partition structure surrounding the chips.

13. The light emitting device package of claim 12, wherein the molding member is transparent.

14. The light emitting device package of claim 12, wherein the light emitting device package comprises the metal layer, and
wherein the metal layer is disposed above the molding member, and comprises at least one of titanium and chromium.

15. The light emitting device package of claim 12, wherein the light emitting device package comprises the colored lower layer, and
wherein the colored lower layer is disposed below the molding member, and comprises a black resin.

16. The light emitting device package of claim 12, wherein the light emitting device package comprises the partition structure, and
wherein the partition structure is disposed to surround the chips, and comprises at least one of a metal, a colored material, and a ceramic material.

17. The light emitting device package of claim 16, wherein the metal comprises at least one of copper and aluminum,
wherein the colored material comprises a black resin, and
wherein the ceramic material comprises glass frit.

18. The light emitting device package of claim 17, wherein a height of the partition structure is greater than a height of each of the chips, and smaller than a height of the molding member.

19. The light emitting device package of claim 18, wherein the partition structure has an elastic modulus of 2.0 GPa or greater and a thermal expansion coefficient of 10 to 30 ppm/° C.

20. A light emitting device package comprising a plurality of pixel sets, wherein at least one of the pixel sets comprises:
a first pixel region comprising:
a plurality of first light emitting chips configured to emit respective wavelength lights;

a plurality of first wirings connected to the first chips, respectively, and comprising a first common wiring commonly connected to the first chips; and a plurality of first electrode pads disposed below the first chips, and connected to the first wirings, respectively;

a second pixel region adjacent to the first pixel region and comprising:

a plurality of second light emitting chips configured to emit the respective wavelength lights;

a plurality of second wirings connected to the second chips, respectively, and comprising a second common wiring commonly connected to the second chips; and a plurality of second electrode pads disposed below the second chips, and connected to the second wirings; and a molding member disposed above the first pixel region and the second pixel region, and comprising a translucent material, wherein the first pixel region shares at least one of the first electrode pads included therein with the second pixel region such that at least one of the second wirings included in the second pixel region is connected to the shared electrode pad in the first pixel region.

* * * * *